United States Patent
Benjamin et al.

(10) Patent No.: US 10,192,767 B2
(45) Date of Patent: Jan. 29, 2019

(54) CERAMIC ELECTROSTATIC CHUCK INCLUDING EMBEDDED FARADAY CAGE FOR RF DELIVERY AND ASSOCIATED METHODS FOR OPERATION, MONITORING, AND CONTROL

(71) Applicant: Lam Research Corporation, Fremont, CA (US)

(72) Inventors: Neil Martin Paul Benjamin, Palo Alto, CA (US); Henry Povolny, Newark, CA (US); Anthony J. Ricci, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/108,632

(22) Filed: Aug. 22, 2018

(65) Prior Publication Data

US 2018/0358254 A1  Dec. 13, 2018

Related U.S. Application Data

(63) Continuation of application No. 15/690,203, filed on Aug. 29, 2017, now Pat. No. 10,079,168.

(60) Provisional application No. 62/419,299, filed on Nov. 8, 2016.

(51) Int. Cl.
*H01L 21/683* (2006.01)
*H01J 37/32* (2006.01)
*H01L 21/66* (2006.01)
*H01L 21/67* (2006.01)

(52) U.S. Cl.
CPC .... *H01L 21/6833* (2013.01); *H01J 37/32082* (2013.01); *H01L 21/67253* (2013.01); *H01L 22/26* (2013.01); *H01J 2237/334* (2013.01)

(58) Field of Classification Search
CPC ........... H01L 21/6833; H01L 21/67253; H01L 22/26; H01J 37/32082; H01J 2237/334
See application file for complete search history.

(56) References Cited

U.S. PATENT DOCUMENTS 6,108,189 A * 8/2000 Weldon ............... C23C 16/4586
279/128

* cited by examiner

*Primary Examiner* — Kyoung Lee
(74) *Attorney, Agent, or Firm* — Martine Penilla Group, LLP

(57) ABSTRACT

A ceramic assembly is attached to a lower support structure having a bowl shape. The ceramic assembly has a top surface configured to support a substrate. At least one clamp electrode is positioned within an upper region of the ceramic assembly. A primary radiofrequency (RF) power delivery electrode is positioned within the ceramic assembly at a location vertically below the at least one clamp electrode such that a region of the ceramic assembly between the primary RF power delivery electrode and the at least one clamp electrode is substantially free of other electrically conductive material. A plurality of RF power delivery connection modules is distributed in a substantially uniform manner about a perimeter of the ceramic assembly. Each of the RF power delivery connection modules is configured to form an electrical connection from the lower support structure to the primary RF power delivery electrode at its respective location.

20 Claims, 14 Drawing Sheets

View A-A

View A-A

View A-A

```
                                                                    ┌─ 801
┌─────────────────────────────────────────────────────────────────────┐
│ Form ceramic assembly having a top surface including an area configured to │
│ support a substrate by:                                              │
│     positioning a clamp electrode within the ceramic assembly in an  │
│ orientation substantially parallel to the top surface of the ceramic assembly and │
│ at an upper location within the ceramic assembly such that a region of the │
│ ceramic assembly between the clamp electrode and the top surface of the │
│ ceramic assembly is free of other electrically conductive material,  │
│     positioning a primary RF power delivery electrode within the ceramic │
│ assembly in an orientation substantially parallel to the top surface of the │
│ ceramic assembly and at a location vertically below the clamp electrode such │
│ that a region of the ceramic assembly between primary RF power delivery │
│ electrode and the clamp electrode is free of other electrically conductive │
│ material, wherein the primary RF power delivery electrode is configured to │
│ extend horizontally through the ceramic assembly to at least span an area │
│ underlying the area of the top surface of the ceramic assembly that is │
│ configured to support the substrate,                                 │
│     positioning a plurality of RF power delivery connection modules in a │
│ substantially uniformly distributed manner about a perimeter of the ceramic │
│ assembly, each of the plurality of RF power delivery connection modules │
│ configured to form an electrical connection from a lower support structure to the │
│ primary RF power delivery electrode at its respective location so as to form an │
│ RF power transmission path from the lower support structure to the primary RF │
│ power delivery electrode at its respective location.                 │
└─────────────────────────────────────────────────────────────────────┘
                                    │
                                    ▼                           ┌─ 803
┌─────────────────────────────────────────────────────────────────────┐
│ Attach the ceramic assembly to the lower support structure, with the lower │
│ support structure formed of an electrically conductive material, and with the │
│ lower support structure having a bowl shape formed by a bottom plate member │
│ and an annular-shaped wall member extending upward from the bottom plate │
│ member, and with the ceramic assembly attached to the lower support structure │
│ such that an outer peripheral region of a bottom surface of the ceramic │
│ assembly is supported by a top surface of the annular-shaped wall member of │
│ the lower support structure with an interior region of the lower support structure │
│ exposed to a portion the bottom surface of the ceramic assembly.    │
└─────────────────────────────────────────────────────────────────────┘
```

Fig. 8

CERAMIC ELECTROSTATIC CHUCK INCLUDING EMBEDDED FARADAY CAGE FOR RF DELIVERY AND ASSOCIATED METHODS FOR OPERATION, MONITORING, AND CONTROL

CLAIM OF PRIORITY

This application is a continuation application under 35 U.S.C. 120 of prior U.S. Non-Provisional application Ser. No. 15/690,203, filed on Aug. 29, 2017, which claims priority under 35 U.S.C. 119(e) to U.S. Provisional Patent Application No. 62/419,299, filed Nov. 8, 2016. The disclosure each above-identified application is incorporated herein by reference in its entirety.

CROSS-REFERENCE TO RELATED APPLICATIONS

This application is related to the following applications:
U.S. Provisional Application 62/197,253, filed on Jul. 27, 2015
U.S. Non-Provisional application Ser. No. 15/170,295, filed on Jun. 1, 2016, issued as U.S. Pat. No. 9,673,025, on Jun. 6, 2017
U.S. Non-Provisional application Ser. No. 15/607,147, filed on May 26, 2017
U.S. Non-Provisional application Ser. No. 15/628,528, filed on Jun. 20, 2017
U.S. Provisional Application 62/419,284, filed on Nov. 8, 2016.
The disclosure of each above-identified application and patent is incorporated herein by reference in its entirety for all purposes.

BACKGROUND

1. Field of the Invention

The present invention relates to semiconductor device fabrication.

2. Description of the Related Art

Many modern semiconductor chip fabrication processes are performed within a plasma processing chamber in which a substrate, e.g., wafer, is supported on an electrostatic chuck. In some cases, radiofrequency (RF) signals are transmitted through the electrostatic chuck to provide for generation and/or RF biasing of a plasma within a region overlying the electrostatic chuck. The RF signals are generally transmitted to the bottom of the electrostatic chuck and flow through the internal structure of the electrostatic chuck by capacitive coupling to reach the region overlying the electrostatic chuck. The internal structure of the electrostatic chuck can vary between different electrostatic chucks, thereby introducing variation in the transmission of the RF signals through different electrostatic chucks. Also, the internal structure of the electrostatic chuck can vary azimuthally, thereby causing azimuthal non-uniformity in the transmission of the RF signals through the electrostatic chuck. It is within this context that the present invention arises.

SUMMARY

In an example embodiment, an electrostatic chuck is disclosed. The electrostatic chuck includes a ceramic assembly having a top surface including an area configured to support a substrate. The electrostatic chuck also includes at least one clamp electrode positioned within the ceramic assembly in an orientation substantially parallel to the top surface of the ceramic assembly and at an upper location within the ceramic assembly, such that a region of the ceramic assembly between the at least one clamp electrode and the top surface of the ceramic assembly is substantially free of other electrically conductive material. The electrostatic chuck also includes a primary radiofrequency (RF) power delivery electrode positioned within the ceramic assembly in an orientation substantially parallel to the top surface of the ceramic assembly and at a location vertically below the at least one clamp electrode such that a region of the ceramic assembly between primary RF power delivery electrode and the at least one clamp electrode is substantially free of other electrically conductive material. The primary RF power delivery electrode is configured to extend horizontally through the ceramic assembly to at least span an area underlying the area of the top surface of the ceramic assembly that is configured to support the substrate. The electrostatic chuck also includes a lower support structure formed of an electrically conductive material. The lower support structure has a bowl shape formed by a bottom plate member and an annular-shaped wall member extending upward from the bottom plate member. The ceramic assembly is secured to the lower support structure, such that an outer peripheral region of a bottom surface of the ceramic assembly is supported by a top surface of the annular-shaped wall member of the lower support structure with an interior region of the lower support structure exposed to a portion the bottom surface of the ceramic assembly. The electrostatic chuck also includes a plurality of RF power delivery connection modules distributed in a substantially uniform manner about a perimeter of the ceramic assembly. Each of the plurality of RF power delivery connection modules is configured to form an electrical connection from the lower support structure to the primary RF power delivery electrode at its respective location so as to form an RF power transmission path from the lower support structure to the primary RF power delivery electrode at its respective location. The lower support structure, the plurality of RF power delivery connection modules, and the primary RF power delivery electrode together form a Faraday cage to direct RF power transmission around an interior region of the electrostatic chuck.

In an example embodiment, a system is disclosed for plasma processing. The system includes a processing chamber, an electrostatic chuck, and an RF power source. The electrostatic chuck is positioned within the processing chamber. The electrostatic chuck includes a ceramic assembly having a top surface including an area configured to support a substrate. The electrostatic chuck also includes at least one clamp electrode positioned within the ceramic assembly in an orientation substantially parallel to the top surface of the ceramic assembly and at an upper location within the ceramic assembly, such that a region of the ceramic assembly between the at least one clamp electrode and the top surface of the ceramic assembly is substantially free of other electrically conductive material. The electrostatic chuck also includes a primary RF power delivery electrode positioned within the ceramic assembly in an orientation substantially parallel to the top surface of the ceramic assembly and at a location vertically below the at least one clamp electrode, such that a region of the ceramic assembly between primary RF power delivery electrode and the at least one clamp electrode is substantially free of other electrically conductive material. The primary RF power delivery electrode is configured to extend horizontally through the ceramic assembly to at least span an area underlying the area of the top surface of the ceramic assembly that is configured to support the substrate. The electrostatic chuck also includes a lower support structure formed of an electrically conductive material. The lower support structure has a bowl shape formed by a bottom plate member and an annular-shaped wall member extending upward from the bottom plate member. The ceramic assembly is secured to the lower support structure, such that an outer peripheral region of a bottom surface of the ceramic assembly is supported by a top surface of the annular-shaped wall member of the lower support structure with an interior region of the lower support structure exposed to a portion the bottom surface of the ceramic assembly. The electrostatic chuck also includes a plurality of RF power delivery connection modules distributed in a substantially uniform manner about a perimeter of the ceramic assembly. Each of the plurality of RF power delivery connection modules is configured to form an electrical connection from the lower support structure to the primary RF power delivery electrode at its respective location so as to form an RF power transmission path from the lower support structure to the primary RF power delivery electrode at its respective location. The RF power source is connected to transmit RF power to the lower support structure of the electrostatic chuck. The lower support structure, the plurality of RF power delivery connection modules, and the primary RF power delivery electrode together form a Faraday cage to direct RF power transmission around an interior region of the electrostatic chuck.

In an example embodiment, a method is disclosed for manufacturing an electrostatic chuck. The method includes forming a ceramic assembly having a top surface including an area configured to support a substrate. Forming the ceramic assembly includes positioning at least one clamp electrode within the ceramic assembly in an orientation substantially parallel to the top surface of the ceramic assembly and at an upper location within the ceramic assembly, such that a region of the ceramic assembly between the at least one clamp electrode and the top surface of the ceramic assembly is substantially free of other electrically conductive material. Forming the ceramic assembly includes positioning a primary RF power delivery electrode within the ceramic assembly in an orientation substantially parallel to the top surface of the ceramic assembly and at a location vertically below the at least one clamp electrode, such that a region of the ceramic assembly between primary RF power delivery electrode and the at least one clamp electrode is substantially free of other electrically conductive material. The primary RF power delivery electrode is configured to extend horizontally through the ceramic assembly to at least span an area underlying the area of the top surface of the ceramic assembly that is configured to support the substrate. Forming the ceramic assembly also includes positioning a plurality of RF power delivery connection modules in a substantially uniformly distributed manner about a perimeter of the ceramic assembly. Each of the plurality of RF power delivery connection modules is configured to form an electrical connection from a lower support structure to the primary RF power delivery electrode at its respective location so as to form an RF power transmission path from the lower support structure to the primary RF power delivery electrode at its respective location. The method also includes attaching the ceramic assembly to the lower support structure. The lower support structure is formed of an electrically conductive material. The lower support structure has a bowl shape formed by a bottom plate member and an annular-shaped wall member extending upward from the bottom plate member. The ceramic assembly is attached to the lower support structure such that an outer peripheral region of a bottom surface of the ceramic assembly is supported by a top surface of the annular-shaped wall member of the lower support structure with an interior region of the lower support structure exposed to a portion the bottom surface of the ceramic assembly. The lower support structure, the plurality of RF power delivery connection modules, and the primary RF power delivery electrode together form a Faraday cage to direct RF power transmission around an interior region of the electrostatic chuck.

BRIEF DESCRIPTION OF THE DRAWINGS

FIG. 8 shows a flowchart of a method for manufacturing an electrostatic chuck, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
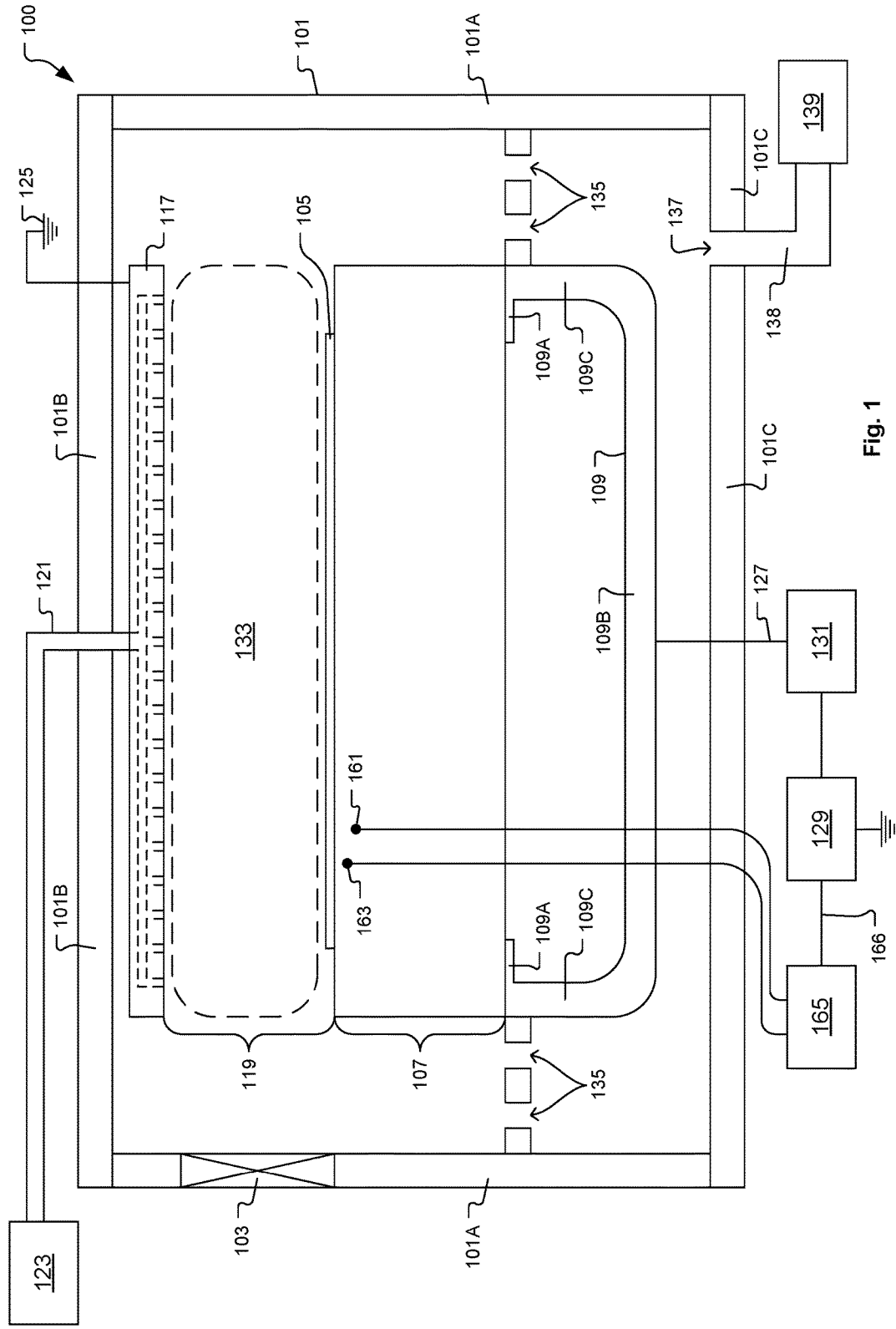
FIG. 1 shows a system for plasma processing that includes a plasma processing chamber, in accordance with some embodiments of the present invention.

FIG. 1 shows a system for plasma processing that includes a plasma processing chamber 100, in accordance with some embodiments of the present invention. The plasma processing chamber 100 includes an exterior structure 101 defined by one or more side walls 101A, a top structure 101B, and a bottom structure 101C. In some embodiments, the exterior structure 101 of the plasma processing chamber 100 can be formed of an electrically conductive material and have an electrical connection to a reference ground potential. In some embodiments, the plasma processing chamber 100 can include a closable entryway 103 through which a substrate 105 can be inserted into and removed from the plasma processing chamber 100. In other embodiments, an upper portion of the processing chamber 100 can be configured to separate from a lower portion of the process chamber 100 to enable insertion and removal of the substrate 105.

The plasma processing chamber includes an electrostatic chuck 107 disposed on a lower support structure 109. The electrostatic chuck 107 is formed as a ceramic assembly. In some embodiments, the electrostatic chuck 107 includes multiple layers of a ceramic material and other internal materials assembled in a stacked and co-fired manner. The lower support structure 109 is formed of an electrically conductive material and has a bowl-shape formed by a bottom plate member 109B and an annular-shaped wall member 109C extending upward from the bottom plate member 109B. The ceramic assembly of the electrostatic chuck 107 is secured to the lower support structure 109 such that an outer peripheral region of a bottom surface of the ceramic assembly of the electrostatic chuck 107 is supported by a top surface of the annular-shaped wall member 109C of the lower support structure 109 with an interior region of the lower support structure 109 exposed to a portion the bottom surface of the ceramic assembly of the electrostatic chuck 107.

In some embodiments, the lower support structure 109 includes an upper flange structure 109A configured to support the electrostatic chuck 107 at an outer periphery of the lower surface of the electrostatic chuck 107. In some embodiments, the lower support structure 109 and its upper flange structure 109A are formed of aluminum. However, in other embodiments, the lower support structure 109 and its upper flange structure 109A can be formed of other materials or combinations of materials, so long as they provide sufficient electrical conduction, thermal conduction, and mechanical strength to support operation of the electrostatic chuck 107. A top surface of the electrostatic chuck 107 includes an area configured to support the substrate 105 during processing. In some embodiments, the top surface of the electrostatic chuck 107 is formed by co-planar top surfaces of multiple raised structures referred to as mesa structures. With the substrate 105 supported on the top surfaces of the mesa structures, the regions between the sides of the mesa structures provide for flow of a fluid, such as helium gas, against the backside of the substrate 105 to provide for enhanced temperature control of the substrate 105.

The plasma processing chamber 100 further includes a top electrode 117 disposed over the electrostatic chuck 107, such that a plasma processing region 119 exists between the electrostatic chuck 107 and the top electrode 117. In some embodiments, the top electrode 117 is electrically connected to a reference ground potential 125. A process gas supply line 121 is plumbed to supply a process gas from a process gas source 123 to the plasma processing region 119. In some embodiments, the process gas supply line 121 is configured to simply dispense the process gas at one or more locations within the plasma processing chamber 100. In some embodiments, the top electrode 117 is defined as a showerhead electrode including a number of internal flow channels leading to a number of dispense ports, with the process gas supply line 121 plumbed to an input of the showerhead electrode so that the process gas can be flowed through the number of internal flow channels to the number of dispense ports and into the plasma processing region 119 in a distributed manner.

An RF power source 129 is connected to supply RF signals through a matching module 131 to a connection 127, with the connection 127 configured to transmit the supplied RF signals to the lower support structure 109. During operation, the process gas is flowed into the plasma processing region 119, and the RF signals are supplied to the lower support structure 109. The RF signals are transmitted from the lower support structure 109 through the electrostatic chuck 107, and through the plasma processing region 119 to the top electrode 117. The RF signals transform the process gas within the plasma processing region 119 into a plasma 133 in exposure to the substrate 105, whereby reactive constituents of the plasma 133, such as ions and/or radicals, operate to modify exposed portions of the substrate 105. In some embodiments, gases within the processing chamber 100 flow from the plasma processing region 119 through side vents 135 to an exhaust port 137, which is plumbed through a connection 138 to an exhaust module 139 configured to draw fluids from the internal volume of the processing chamber 100.

It should be understood that the plasma processing chamber 100 is presented herein in a simplified manner for ease of description. In reality, the plasma processing chamber 100 is a complex system that includes many components not described herein. However, what should be appreciated for the present discussion is that the plasma processing chamber 100 is connected to receive controlled flows of one or more process gas composition(s) under carefully controlled conditions and includes the electrostatic chuck 107 for holding the substrate 105, where the electrostatic chuck 107 is connected to transmit RF signals to the plasma processing region 119 to transform the one or more process gas composition(s) into the plasma 133 to enable processing of the substrate 105 in a specified manner and/or for RF biasing of the plasma 133 within the plasma processing region 119 overlying the electrostatic chuck 107. Examples of plasma processing operations that may performed by the plasma processing chamber 100 include etching operations, deposition operations, and ashing operations, among others.

The plasma processing chamber 100 is an example of a type of capacitively coupled plasma (CCP) processing chamber that utilizes the electrostatic chuck 107. It should be understood, however, that the electrostatic chuck 107 can be utilized in other types of plasma processing chambers, such as inductively coupled plasma (ICP) processing chambers and transformer coupled plasma (TCP) processing chambers, in which RF signals may be transmitted from the electrostatic chuck 107 to a plasma processing region above a substrate held by the electrostatic chuck 107. The disclosure herein primarily concerns improvements in the design and operation of the electrostatic chuck 107. Therefore, it should be understood that the various example embodiments of the electrostatic chuck 107 disclosed herein can be utilized with essentially any type of plasma processing chamber, with the plasma processing chamber 100 of FIG. 1 providing an example for discussion purposes.

In an example embodiment, the term substrate 105 as used herein refers to a semiconductor wafer. However, it should be understood that in other embodiments, the term substrate 105 as used herein can refer to substrates formed of sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 as referred to herein may correspond to a 200 mm (millimeters) semiconductor wafer, a 300 mm semiconductor wafer, or a 450 mm semiconductor wafer. Also, in some embodiments, the substrate 105 as referred to herein may correspond to a non-circular substrate, such as a rectangular substrate for a flat panel display, or the like, among other shapes.

Figure 2A:
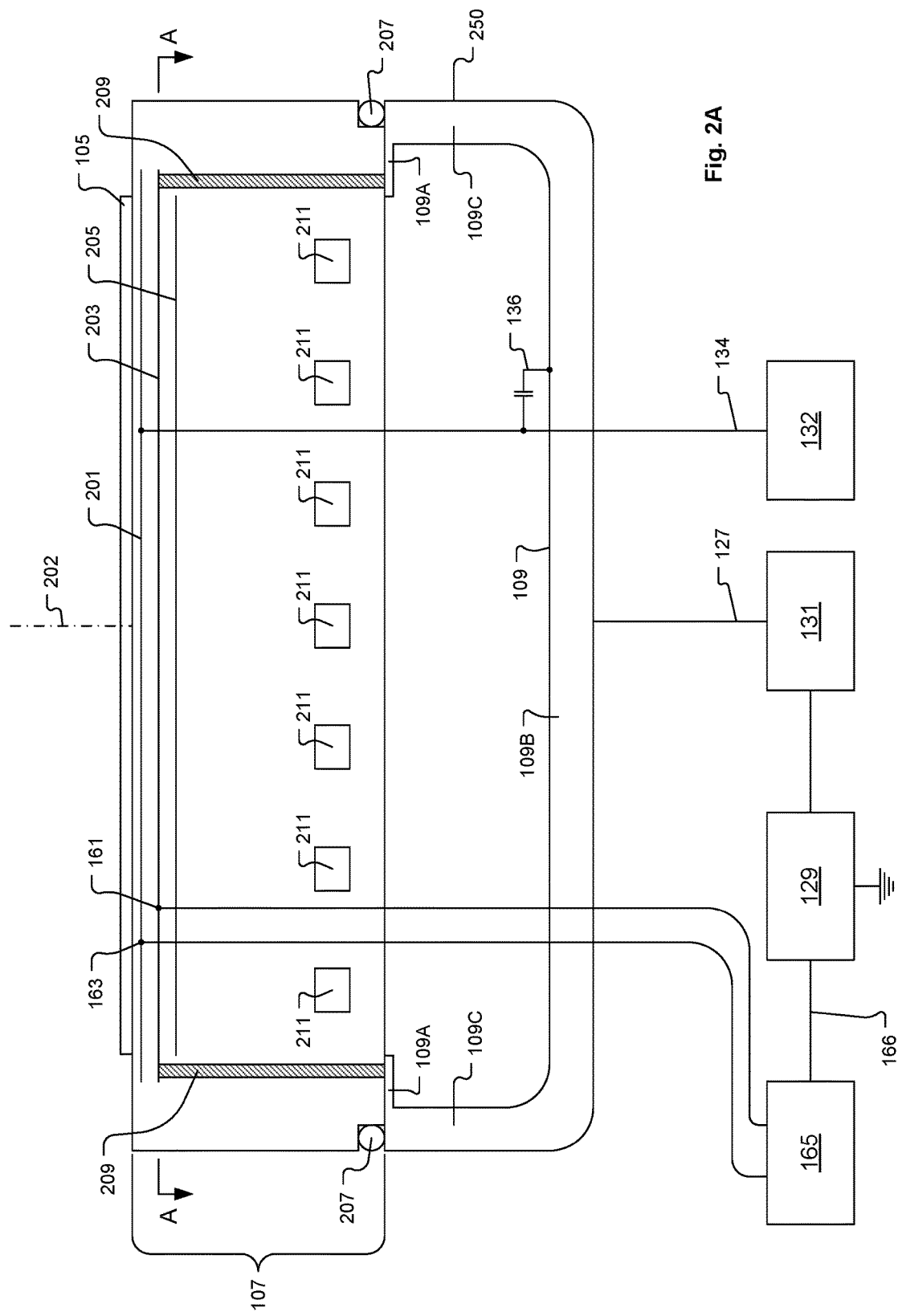
FIG. 2A shows the ceramic material of the electrostatic chuck configured to include one or more clamp electrode(s), a primary RF power delivery electrode, and one or more resistance heaters, in accordance with some embodiments of the present invention.

FIG. 2A shows the ceramic material of the electrostatic chuck 107 configured to include one or more clamp electrode(s) 201, a primary RF power delivery electrode 203, and one or more resistance heaters 205, in accordance with some embodiments of the present invention. In some embodiments, the clamp electrode(s) 201 can be a single electrode used to generate an electrical field for holding the substrate 105 on the top surface of the electrostatic chuck 107. In some embodiments, the clamp electrode(s) 201 can include two separate clamp electrodes configured for bipolar operation in which a differential voltage is applied between the two separate clamp electrodes to generated an electrical field for holding the substrate 105 on the top surface of the electrostatic chuck 107. In various embodiments, the two separate clamp electrodes can be geometrically interdigitated or interleaved to enable the bipolar operation. In some embodiments, the clamp electrode(s) 201 can include three or more separate clamp electrodes connected to operate in a multiphasic manner. Each of the clamp electrode(s) 201 is connected to a DC voltage supply 132 through a connection 134. In some embodiments, one or more capacitors 136 can be electrically connected between the clamp electrodes(s) 201 and the lower support structure 109 to provide for filtering of RF signals. The DC voltage supply 132 is configured to control a voltage present on the clamp electrode(s) 201. In the embodiments in which the clamp electrode(s) 201 includes multiple separate clamp electrodes, each of the multiple separate clamp electrodes is connected to the DC voltage supply 132 (or to separate DC voltage supplies 132, respectively), such that its voltage and/or phase is controlled in an independent manner relative to the other clamp electrode(s) 201.

In some embodiments, a perimeter seal 207 is disposed between a bottom surface of the electrostatic chuck 107 and a top surface of the lower support structure 109. The perimeter seal 207 is configured to prevent entry of plasma 133 constituents and/or process by-product materials into the region within the lower support structure 109.

In various embodiments, the electrostatic chuck 107 can be configured to include various cooling mechanisms, heating mechanisms, clamping mechanisms, bias electrodes, substrate lifting pins, and sensors, where the sensors can provide for measurement of temperature, pressure, electrical voltage, and/or electrical current, among other parameters. For example, the ceramic of the electrostatic chuck 107 can be configured to include a number of cooling channels 211 through which a cooling fluid can be flowed. Also, the ceramic of the electrostatic chuck 107 can include an arrangement of fluid flow channels through which a backside gas can be flowed and dispensed into the region between the mesa structures underlying the substrate 105. It should be appreciated that the lower support structure 109 can be configured to hold various circuitry, plumbing, control components, and supporting parts for the internal components of the electrostatic chuck 107, such as for the resistance heater(s) 205, backside gas delivery system, substrate lifting pins, clamp electrode(s) 201, cooling channels 211, sensors, etc.

For discussion purposes, consider an embodiment of the electrostatic chuck 107 without the primary RF power delivery electrode 203. In this embodiment, for high frequency RF power applications, e.g., RF frequencies of about 1 MHz and greater, the clamp electrode(s) 201 may be relied upon to distribute the RF signals to the plasma processing region 119. For example, in some cases, the RF signals may be applied to the lower support structure 109 with reliance upon capacitive coupling of the RF signals through the electrostatic chuck 107 to the clamp electrode(s) 201 and ultimately to the plasma processing region 119. However, there are difficulties associated with transmitting RF signals through the interior of the electrostatic chuck 107. For example, with transmission of RF signals through the interior of the electrostatic chuck 107, there is a possibility of striking an unwanted (parasitic) plasma within various interior regions of the electrostatic chuck 107 which could cause damage and/or de-chucking of the substrate 105. Also, RF signals transmitted through the interior of the electrostatic chuck 107 can couple through elements of the resistance heater(s) 205, which can cause non-uniformity in the RF current distribution reaching the plasma processing region 119, and in turn adversely affect process uniformity, e.g., etch uniformity and critical dimension uniformity. Additionally, RF signals transmitted through the interior of the electrostatic chuck 107 can damage various circuitry therein, such as drive circuits of the resistance heater(s) 205, among other circuitry. And, with lower frequency RF power applications, e.g., RF frequencies of less than about 1 MHz, the electrostatic chuck 107 appears as a high impedance insulator to the RF signals. Therefore, in lower frequency RF power applications, it is difficult to rely on transmission of lower frequency RF signals from the lower support structure 109 through the ceramic of the electrostatic chuck 107 to the plasma processing region 119 without including parallel coupling mechanisms, such as external capacitors.

With the primary RF power delivery electrode 203 present within the electrostatic chuck 107, it is not necessary to transmit RF signals through problematic interior regions of the electrostatic chuck 107, and it is not necessary to electrically connect the clamp electrode(s) 201 for direct RF power transmission. The primary RF power delivery electrode 203 provides for safe and reliable delivery of RF signals to the plasma processing region 119 across a broad spectrum of lower and higher RF signal frequencies.

With reference back to FIG. 2A, the primary RF power delivery electrode 203 is positioned within the ceramic of the electrostatic chuck 107 in an orientation substantially parallel to the top surface of the electrostatic chuck 107 and at a location vertically below the clamp electrode(s) 201, such that a region of the electrostatic chuck 107 between the primary RF power delivery electrode 203 and the clamp electrode(s) 201 is substantially free of other electrically conductive material. Also, the primary RF power delivery electrode 203 is configured to extend horizontally through the ceramic of the electrostatic chuck 107 to at least span an area underlying the area of the top surface of the electrostatic chuck 107 that is configured to support the substrate 105. The primary RF power delivery electrode 203 is placed near the top of the electrostatic chuck 107 to optimize reactive capacitance. It should also be noted that in the electrostatic chuck 107 configuration of FIG. 2A, the clamp electrode(s) 201 is positioned within the ceramic of the electrostatic chuck 107 in an orientation substantially parallel to the top surface of the electrostatic chuck 107 and at an upper location within the ceramic of the electrostatic chuck 107, such that the region of the electrostatic chuck 107 between the clamp electrode(s) 201 and the top surface of the electrostatic chuck 107 is substantially free of other electrically conductive material. As shown in FIG. 2A, the primary RF power delivery electrode 203 should be positioned below the clamp electrode(s) 201, such that the electrical field emanating from the clamp electrode(s) 201 is not interfered with by the primary RF power delivery electrode 203.

In some embodiments, the region of the electrostatic chuck 107 between the primary RF power delivery electrode 203 and the clamp electrode(s) 201 being substantially free of other electrically conductive material corresponds to this region including no electrically conductive material. In some embodiments, the region of the electrostatic chuck 107 between the primary RF power delivery electrode 203 and the clamp electrode(s) 201 being substantially free of other electrically conductive material corresponds to this region including sparsely distributed electrically conductive material that does not interfere with transmission of RF signals. In some embodiments, the region of the electrostatic chuck 107 between the primary RF power delivery electrode 203 and the clamp electrode(s) 201 being substantially free of other electrically conductive material corresponds to this region including some electrically conductive material that is electrically isolated from other surrounding electrically conductive materials, i.e., electrically floating. In some embodiments, the region of the electrostatic chuck 107 between the primary RF power delivery electrode 203 and the clamp electrode(s) 201 being substantially free of other electrically conductive material corresponds to this region including electrically conductive material of a thickness small enough to not shield RF signals.

In some embodiments, the region of the electrostatic chuck 107 between the clamp electrode(s) 201 and the top surface of the electrostatic chuck 107 being substantially free of other electrically conductive material corresponds to this region including no electrically conductive material. In some embodiments, the region of the electrostatic chuck 107 between the clamp electrode(s) 201 and the top surface of the electrostatic chuck 107 being substantially free of other electrically conductive material corresponds to this region including sparsely distributed electrically conductive material that does not interfere with transmission of RF signals. In some embodiments, the region of the electrostatic chuck 107 between the clamp electrode(s) 201 and the top surface of the electrostatic chuck 107 being substantially free of other electrically conductive material corresponds to this region including some electrically conductive material that is electrically isolated from other surrounding electrically conductive materials, i.e., electrically floating. In some embodiments, the region of the electrostatic chuck 107 between the clamp electrode(s) 201 and the top surface of the electrostatic chuck 107 being substantially free of other electrically conductive material corresponds to this region including electrically conductive material of a thickness small enough to not shield RF signals.

In some embodiments, the primary RF power delivery electrode 203 is configured as an essentially solid disk-shaped member formed of electrically conductive material, with the exception of various through-holes to accommodate penetrating structures such as substrate lifting pins, electrical connections for the clamp electrode(s) 201, gas flow channels, etc. Also, in some embodiments, the primary RF power delivery electrode 203 is configured as a grid sheet formed of electrically conductive material. In various embodiments, the primary RF power delivery electrode 203 is formed of molybdenum, tantalum, tungsten, palladium, ruthenium, platinum, among others. It should be understood, however, that the primary RF power delivery electrode 203 can be formed of essentially any electrically conductive material, so long as the primary RF power delivery electrode 203 is capable of functioning as a conductor of RF signals of a required frequency and satisfies the mechanical and thermal requirements associated with manufacturing and operation. In some embodiments, a thickness of the primary RF power delivery electrode 203 is about two to three times a skin depth for RF signal transmission at an applied RF signal frequency. As an example, the skin depth for RF signal transmission at an applied RF signal frequency of 13.56 MHz is about 0.0007 inch. As another example, the skin depth for RF signal transmission at an applied RF signal frequency of 400 kHz is about 0.004 inch. In some embodiments, the thickness of the primary RF power delivery electrode 203 is within a range extending from about 0.005 inch to about 0.015 inch. However, it should be understood that in other embodiments, the thickness of the primary RF power delivery electrode 203 can be either less than 0.005 inch or greater than 0.015 inch. Also, in some embodiments, the primary RF power delivery electrode 203 is formed by applying, e.g., laminating, co-firing, etc., a metallic foil during fabrication of the electrostatic chuck 107. And, in some embodiments, during fabrication of the electrostatic chuck 107, the primary RF power delivery electrode 203 is formed using a screen printing process in which an ink is formulated to contain the metal material that forms the primary RF power delivery electrode 203. However, it should be understood that in other embodiments, different methods and techniques can be used to form the primary RF power delivery electrode 203.

To provide for electrical connection of the primary RF power delivery electrode 203 to the lower support structure 109, a plurality of RF power delivery connection modules 209 are distributed in a substantially uniform manner about a perimeter of the electrostatic chuck 107, with each of the plurality of RF power delivery connection modules 209 providing a low impedance transmission path for RF signals between the lower support structure 109 and the primary RF power delivery electrode 203. Each of the plurality of RF power delivery connection modules 209 is configured to form an electrical connection from the lower support structure 109 (more specifically, from the upper flange 109A of the lower support structure 109) to the primary RF power delivery electrode 203 at its respective location so as to form an RF power transmission path from the lower support structure 109 to the primary RF power delivery electrode 203 at its respective location.

Figure 3A:
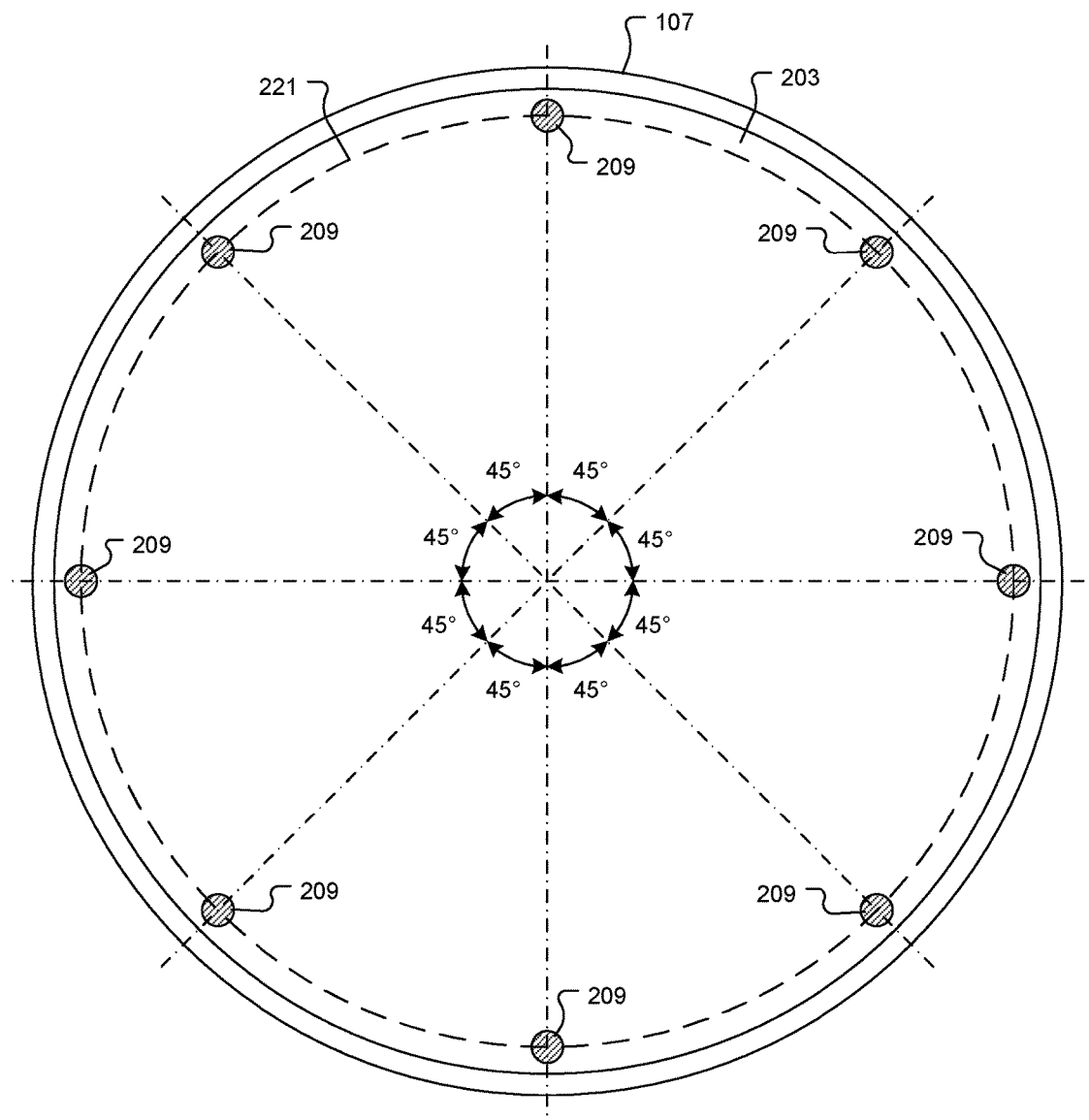
FIG. 3A shows a horizontal cross-section view of the electrostatic chuck extending through the interface between primary RF power delivery electrode and the plurality of RF power delivery connection modules, corresponding to View A-A as referenced in FIG. 2A, in accordance with some embodiments of the present invention.

FIG. 3A shows a horizontal cross-section view of the electrostatic chuck 107 extending through the interface between primary RF power delivery electrode 203 and the plurality of RF power delivery connection modules 209, corresponding to View A-A as referenced in FIG. 2A, in accordance with some embodiments of the present invention. In the example of FIG. 3A, there are eight RF power delivery connection modules 209 distributed in a substantially even manner about the outer periphery of the electrostatic chuck 107 along a circumference 221, with each of the eight RF power delivery connection modules 209 separated from each adjacent one of the eight RF power delivery connection modules 209 by an angle of about 45 degrees as measured about a centerline 202 of the electrostatic chuck 107 extending perpendicular to the top surface of the electrostatic chuck 107. In other embodiments, more than or less than eight RF power delivery connection modules 209 can be used. For instance, another example embodiment can include up to 1000 RF power delivery connection modules 209.

Figure 3B:
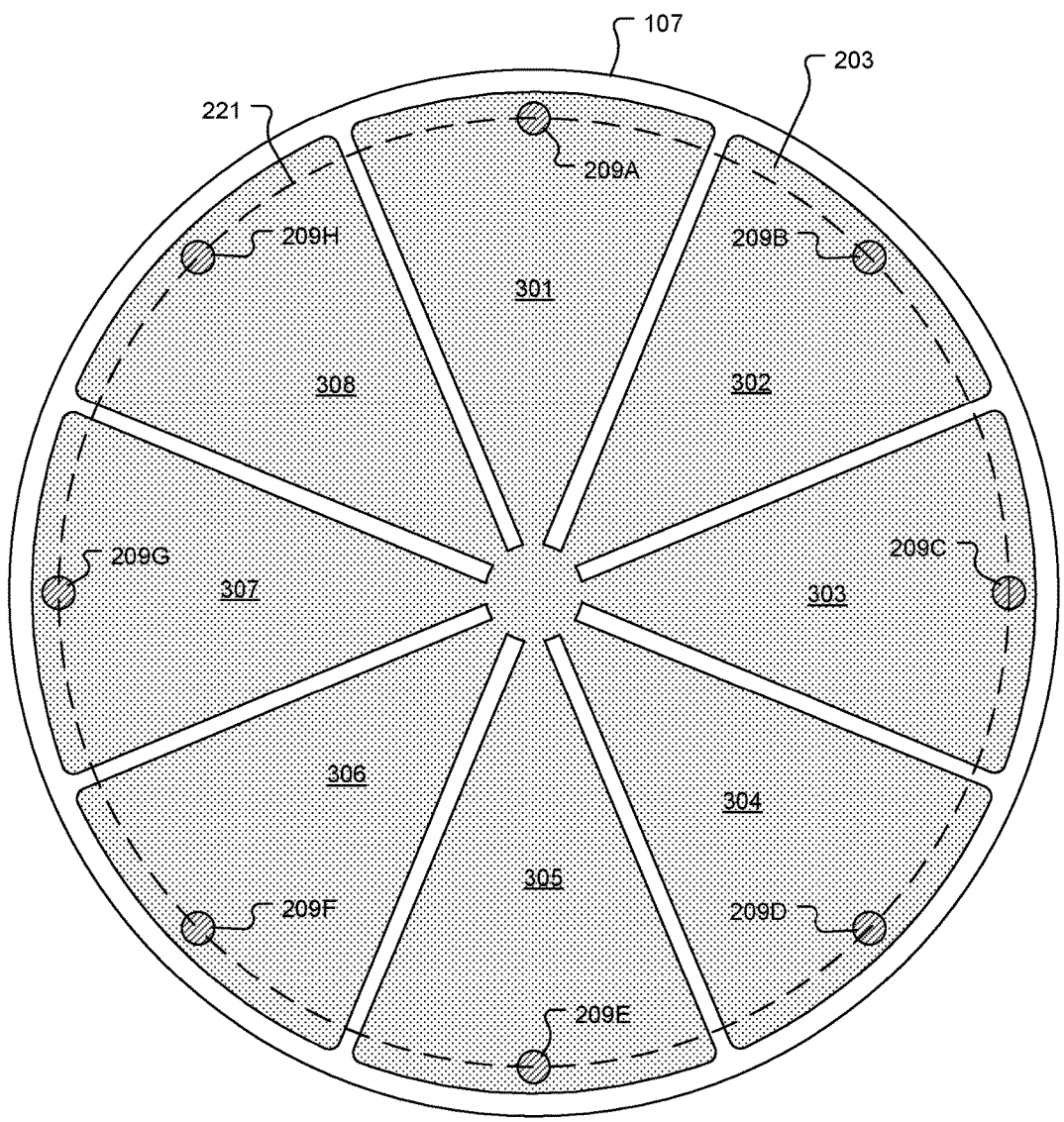
FIG. 3B shows a modified version of the primary RF power delivery electrode of FIG. 3A, in which the primary RF power delivery electrode is interrupted in a radially symmetric manner about the centerline of the electrostatic chuck, in accordance with some embodiments of the present invention.

Also, for some high frequency applications, e.g., 60 MHz or greater, for uniformity reasons, it may be desirable for the primary RF power delivery electrode 203 to have a sectioned shape, such as with petals. FIG. 3B shows a modified version of the primary RF power delivery electrode 203 of FIG. 3A, in which the primary RF power delivery electrode 203 is interrupted in a radially symmetric manner about the centerline 202 of the electrostatic chuck 107, in accordance with some embodiments of the present invention. In the example embodiment of FIG. 3B, gaps 309 separate each region 301-308 of the primary RF power delivery electrode 203 from adjacent regions 301-308 of the primary RF power delivery electrode 203, and each region 301-308 of the primary RF power delivery electrode 203 is connected together near the centerline 202 of the electrostatic chuck 107. Also, each region 301-308 of the primary RF power delivery electrode 203 is connected to receive RF power from the lower support structure 109 through a respective one of the plurality of RF power delivery connection modules 209A-209H, respectively.

Figure 3C:
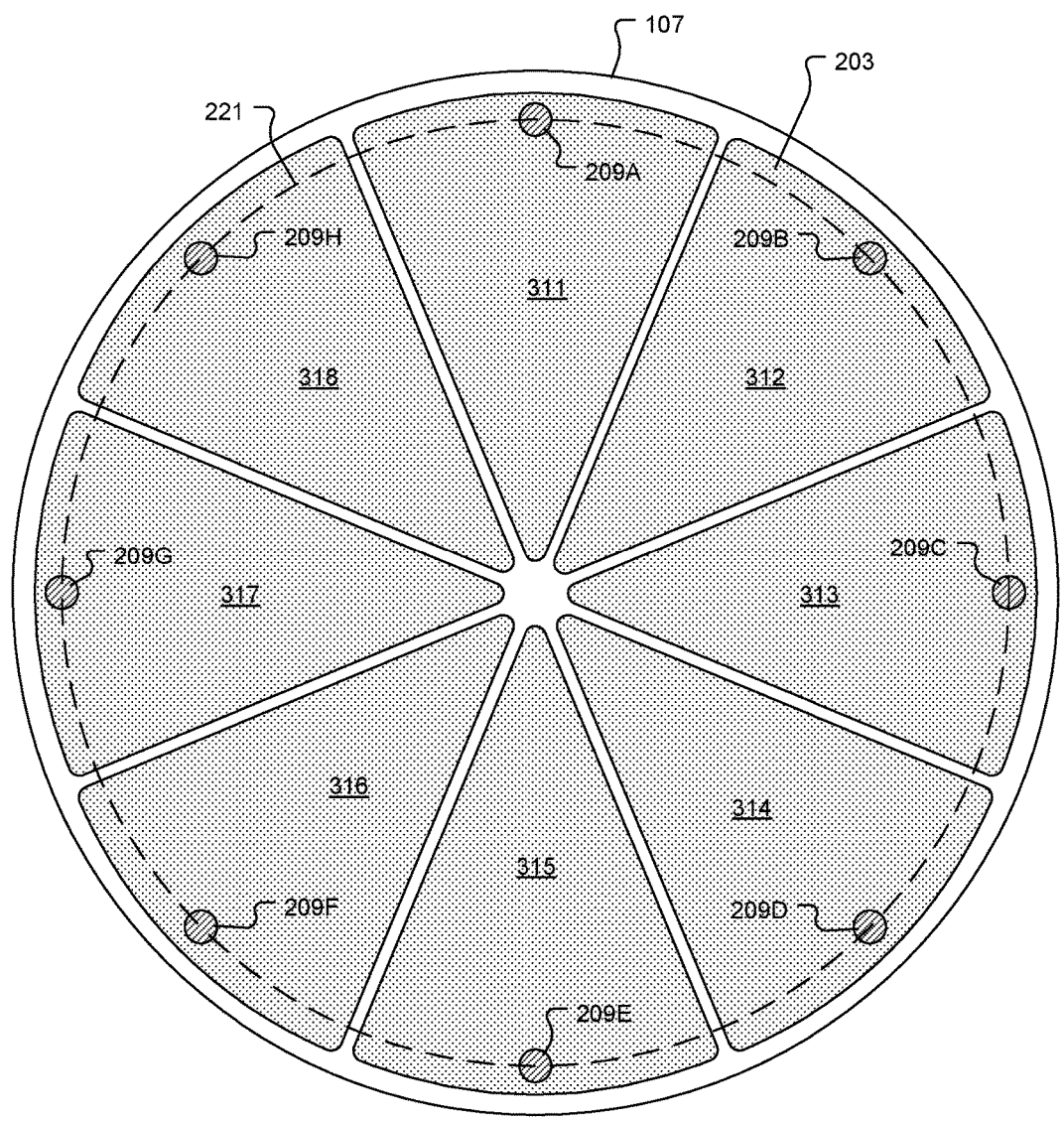
FIG. 3C shows a modified version of the primary RF power delivery electrode of FIG. 3A, in which the primary RF power delivery electrode is sectioned in a radially symmetric manner about the centerline of the electrostatic chuck, in accordance with some embodiments of the present invention.

FIG. 3C shows a modified version of the primary RF power delivery electrode 203 of FIG. 3A, in which the primary RF power delivery electrode 203 is sectioned in a radially symmetric manner about the centerline 202 of the electrostatic chuck 107, in accordance with some embodiments of the present invention. In the example embodiment of FIG. 3C, each section 311-318 of the primary RF power delivery electrode 203 is separated from adjacent sections 311-318 of the primary RF power delivery electrode 203. Also, each section 311-318 of the primary RF power delivery electrode 203 is connected to receive RF power from the lower support structure 109 through a respective one of the plurality of RF power delivery connection modules 209A-209H, respectively. In some embodiments, each of the plurality of RF power delivery connection modules 209A-209H can be connected to receive separately controlled RF signals, such that RF signal transmission through each section 311-318 of the primary RF power delivery electrode 203 can be independently controlled.

To provide for uniform transmission of the RF signals from the lower support structure 109 to the primary RF power delivery electrode 203, the plurality of RF power delivery connection modules 209 can be distributed in a substantially uniform manner about the centerline 202 of the electrostatic chuck 107. However, some adjustments in locations of the plurality of RF power delivery connection modules 209 can be made in order to accommodate their placement around other structures and/or passages within the electrostatic chuck 107. In some embodiments, the plurality of RF power delivery connection modules 209 can be defined as passive connections that provide direct electrical connection between the lower support structure 109 and the primary RF power delivery electrode 203. However, in other embodiments, some or all of the plurality of RF power delivery connection modules 209 can be defined to control an amplitude and/or frequency of RF signals transmitted from the lower support structure 109 to the primary RF power delivery electrode 203. Also, in some embodiments, individual ones of the plurality of RF power delivery connection modules 209 can be configured to control the amplitude and/or frequency of RF signals transmitted therethrough in real-time.

Figure 2B:
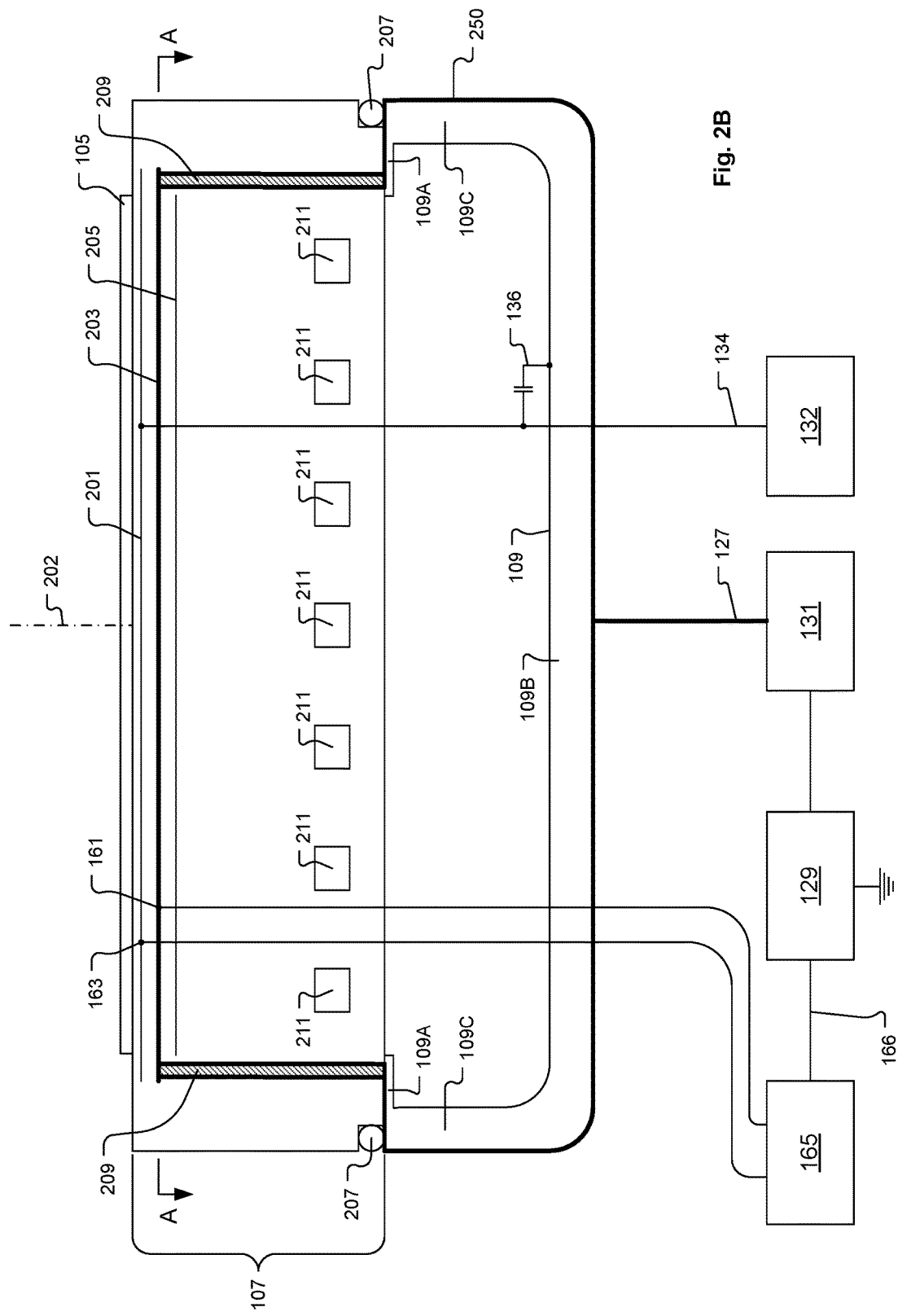
FIG. 2B shows the configuration of FIG. 2A with the RF signal transmission path indicated by the heavy solid line, in accordance with some embodiments of the present invention.

It should be understood that the lower support structure 109, the plurality of RF power delivery connection modules 209, and the primary RF power delivery electrode 203 together form a Faraday cage to direct RF power transmission around an internal volume of the electrostatic chuck 107 present below the primary RF power delivery electrode 203 and within the circumference 221 along which the plurality of RF power delivery connection modules 209 is located. FIG. 2B shows the configuration of FIG. 2A with the RF signal transmission path indicated by the heavy solid line 250, in accordance with some embodiments of the present invention. The RF signals are transmitted from the RF power source 129 through the matching module 131 through the connection 127 to the lower support structure 109. The RF signals then travel around the surface of lower support structure 109 to the upper flange 109A of the lower support structure 109. The RF signals then travel along the surface of the upper flange 109A to each of the plurality of RF power delivery connection modules 209 and then to the primary RF power delivery electrode 203.

By transmitting RF signals from the lower support structure 109 through the plurality of RF power delivery connection modules 209 to the primary RF power delivery electrode 203, the internal volume of the electrostatic chuck 107 is essentially unaffected by RF signal induced electrical fields. Also, RF signal filtering devices can be implemented at various locations where the plurality of RF power delivery connection modules 209 and other intentional RF conductors pass through other electrically conductive components within the electrostatic chuck 107, where it is desired that the other electrically conductive components not conduct RF signals. In this manner, the Faraday cage formed by the lower support structure 109, the plurality of RF power delivery connection modules 209, and the primary RF power delivery electrode 203, along with various RF filtering devices, serve to protect and shield circuitry and connecting layers within the interior of the electrostatic chuck 107 from RF fields. Also, by causing the RF signal induced voltage to appear high up in the electrostatic chuck 107 at the primary RF power delivery electrode 203, there is less likelihood of inadvertently striking a plasma internally within the electrostatic chuck 107. Therefore, it is possible to put electronic components, e.g., heater circuitry, sensor circuitry, etc., within the interior volume of the electrostatic chuck 107 without them being exposed to adverse effects caused by RF current flowing through the entirety of the electrostatic chuck 207 structure.

Also, the Faraday cage formed by the lower support structure 109, the plurality of RF power delivery connection modules 209, and the primary RF power delivery electrode 203 provides for improved consistency in RF signal transmission to the substrate 105 for a broadband of RF signal frequencies, and provides for improved consistency in RF signal transmission to the substrate 105 that is independent of other internal circuitry and associated variations within the electrostatic chuck 107, thereby providing improved consistency in RF signal transmission to the substrate 105 from one electrostatic chuck 107 to another electrostatic chuck 107. Therefore, the Faraday cage formed by the lower support structure 109, the plurality of RF power delivery connection modules 209, and the primary RF power delivery electrode 203 provides for operation of different electrostatic chucks 107 with various RF signal frequencies and harmonics in a more uniform and consistent manner.

Additionally, the position of the primary RF power delivery electrode 203 near the top of the electrostatic chuck 107, just below the clamp electrode(s) 201, provides for transmission of lower RF signal frequencies such as 400 kHz, 100 kHz, 55 kHz, among others. Also, the direct connection of the primary RF power delivery electrode 203 to the lower support structure 109, by way of the plurality of RF power delivery connection modules 209, enables pulsing of lower RF frequency signals, which may be useful for certain plasma processing operations. Also, with the plurality of RF power delivery connection modules 209 configured to transmit higher RF current, it is possible to transmit higher RF current at lower RF signal frequency through the primary RF power delivery electrode 203 to the plasma processing region 119.

Figure 4:
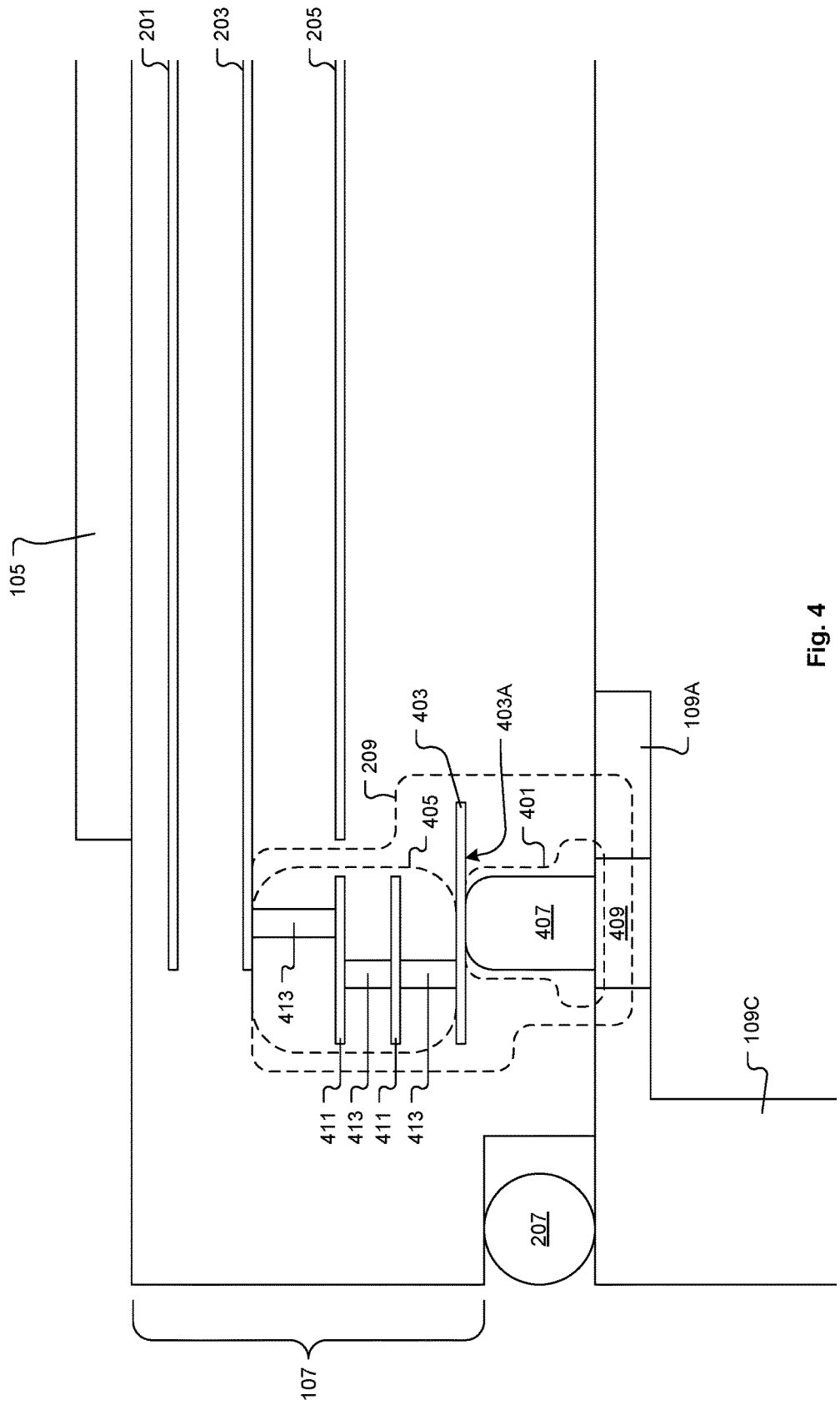
FIG. 4 shows a vertical cross-section view through one of the plurality of RF power delivery connection modules, in accordance with some embodiments of the present invention.

FIG. 4 shows a vertical cross-section view through one of the plurality of RF power delivery connection modules 209, in accordance with some embodiments of the present invention. The RF power delivery connection module 209 includes a first electrical connection 401 extending between the upper flange 109A of the lower support structure 109 and an exposed embedded conductive segment 403 within the electrostatic chuck 107. Also, the RF power delivery connection module 209 includes a second electrical connection 405 extending between the exposed embedded conductive segment 403 through the ceramic of the electrostatic chuck 107 to the primary RF power delivery electrode 203, so as to make an electrical connection between the exposed embedded conductive segment 403 and the primary RF power delivery electrode 203. In some embodiments, the exposed embedded conductive segment 403 is planar shaped. In other embodiments, the exposed embedded conductive segment 403 is non-planar shaped, such as convex shaped, concave shaped, cylindrical shaped, among others. A portion 403A of the exposed embedded conductive segment 403 is exposed at a bottom of the electrostatic chuck 107 and is physically contacted by a member of the first electrical connection 401. In some embodiments, the exposed embedded conductive segment 403 can be plated to enable electrical connection with the first electrical connection 401.

The first electrical connection 401 and the second electrical connection 405 are configured to accommodate thermally induced expansion and contraction of supporting/surrounding/interfacing structures of the electrostatic chuck 107. In some embodiments, the first electrical connection 401 includes an electrically conductive pin 407 in compression against the exposed portion 403A of the exposed embedded conductive segment 403. In some embodiments, the first electrical connection 401 is electrically shorted to the lower support structure 109. In other embodiments, the first electrical connection 401 is electrically isolated from the lower support structure 109, but is disposed such that RF signals will be preferentially transmitted from the lower support structure 109 through the first electrical connection 401. In some embodiments, such as depicted in FIG. 4, the electrically conductive pin 407 is electrically connected to the lower support structure 109 to enable transmission of RF signals from the lower support structure 109 to the electrically conductive pin 407. Specifically, the electrically conductive pin 407 is disposed in electrical connection with its base structure 409, which is in turn disposed in electrical connection with the lower support structure 109. In this configuration, the RF signals travel along the outside surface of the lower support structure 109, across the upper flange 109A of the lower support structure 109, to the base structure 409, to the pin 407, up to the exposed embedded conductive segment 403, and through the second electrical connection 405 to the primary RF power delivery electrode 203. In some embodiments, the electrically conductive pin 407 includes a spring configured to compress the electrically conductive pin 407 against the exposed portion 403A of the exposed embedded conductive segment 403. Also, in some embodiments, the electrically conductive pin 407 is configured to transmit up to 30 amperes of RF current. However, it should be understood that in other embodiments, the electrically conductive pin 407 can be configured to transmit higher or lower amounts of RF current, as appropriate for the processes to be performed by the electrostatic chuck 107.

Additionally, in some embodiments, instead of using the electrically conductive pin 407, the connection between the lower support structure 109 and the exposed embedded conductive segment 403 is made using a brazed connection or a soldered connection. In some embodiments, regardless of the whether the first electrical connection 401 uses the electrically conductive pin 407, or the brazed connection, or the soldered connection, or some other type of connection as an RF conductor, the first electrical connection 401 is configured so that a distance traversed by the RF conductor between the exposed embedded conductive segment 403 and the lower support structure 109 is as small as possible so as to minimize electrical impedance through the first electrical connection 401.

In some embodiments, the second electrical connection 405 includes one or more interior embedded conductive segments 411 within the ceramic of the electrostatic chuck 107. In some embodiments, each of the interior embedded conductive segments 411 is oriented substantially parallel to the primary RF power delivery electrode 203. Also, the second electrical connection 405 can include one or more vertical conductive structures 413 positioned to electrically connect the interior embedded conductive segments 411 to each other (in the case of multiple interior embedded conductive segments 411) and to the exposed embedded conductive segment 403 and to the primary RF power delivery electrode 203. In some embodiments, at least one of the vertical conductive structures 413 extends through the ceramic of the electrostatic chuck 107 between the exposed embedded conductive segment 403 and a lowest one of the interior embedded conductive segments 411, and at least one of the vertical conductive structures 413 extends through the ceramic of the electrostatic chuck 107 between a highest one of the interior embedded conductive segments 411 and the primary RF power delivery electrode 203, and at least one of the vertical conductive structures 413 extends through the ceramic of the electrostatic chuck 107 between each vertically neighboring set of two of the interior embedded conductive segments 411 when present.

It should be appreciated that use of the interior embedded conductive segments 411 is suitable for fabrication of the electrostatic chuck 107 in a stacked manner, with the vertical conductive structures 413 used to connect to the interior embedded conductive segments 411. Also, it should be understood that the vertical conductive structures 413 can be located at different locations on opposite sides of a given interior embedded conductive segment 411. In this manner, electrical connections within the second electrical connection 405 of the RF power delivery connection module 209 can be made at different vertical locations and at different horizontal locations. Also, the vertical conductive structures 413 can be disposed in a redundant manner within a given RF power delivery connection module 209. For example, in some embodiments, in a given one of the RF power delivery connection modules 209, at least four vertical conductive structures 413 extend through the electrostatic chuck 107 between the exposed embedded conductive segment 403 and a lowest one of the interior embedded conductive segments 411, and at least four vertical conductive structures 413 extend through the electrostatic chuck 107 between a highest one of the interior embedded conductive segments 411 and the primary RF power delivery electrode 203, and at least four vertical conductive structures 413 extend through the electrostatic chuck 107 between each vertically neighboring set of two of the interior embedded conductive segments 411 when present.

Figure 5:
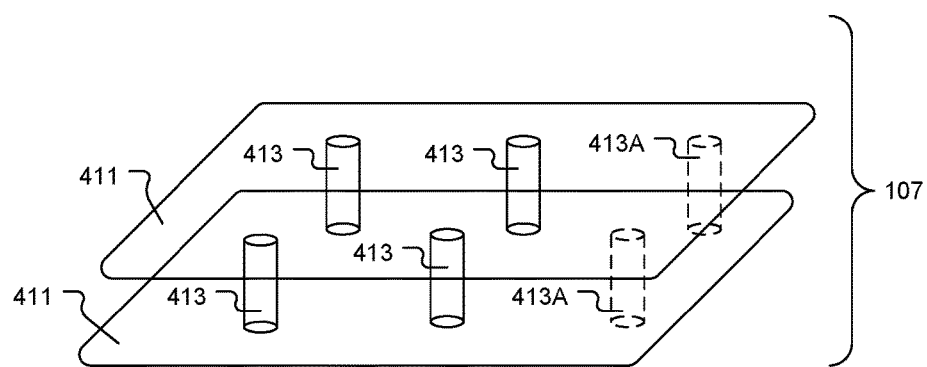
FIG. 5 shows an example of using four vertical conductive structures in a redundant manner between a neighboring set of two of the interior embedded conductive segments, in accordance with some embodiments of the present invention.

FIG. 5 shows an example of using four vertical conductive structures 413 in a redundant manner between a neighboring set of two of the interior embedded conductive segments 411, in accordance with some embodiments of the present invention. It should be understood that the depiction of four vertical conductive structures 413 in the example of FIG. 5 is provided by way of example. In other embodiments, either more or less than four vertical conductive structures 413 can be disposed between a neighboring set of two of the interior embedded conductive segments 411. For example, FIG. 5 shows the option for having additional vertical conductive structures 413A. In various embodiments, the quantity of vertical conductive structures 413 disposed between a neighboring set of two of the interior embedded conductive segments 411 in a given RF power delivery connection module 209 can be determined by the choice of material(s) used to fabricate the vertical conductive structures 413 and/or interior embedded conductive segments 411 and the electrical capacity of those chosen material(s).

Figure 6A:
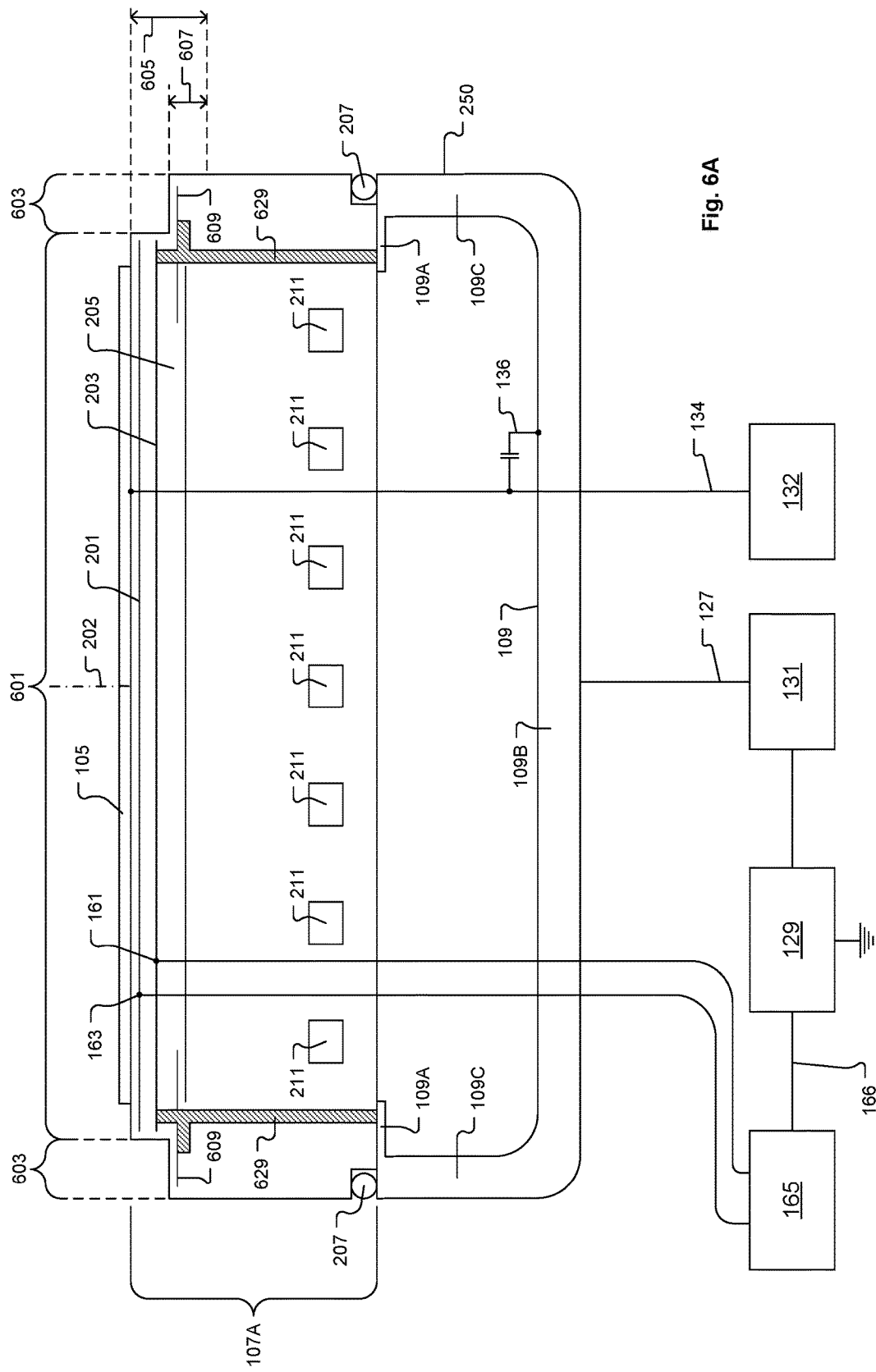
FIG. 6A shows an electrostatic chuck formed of a ceramic material that has a stepped configuration, in accordance with some embodiments of the present invention.
Figure 6B:
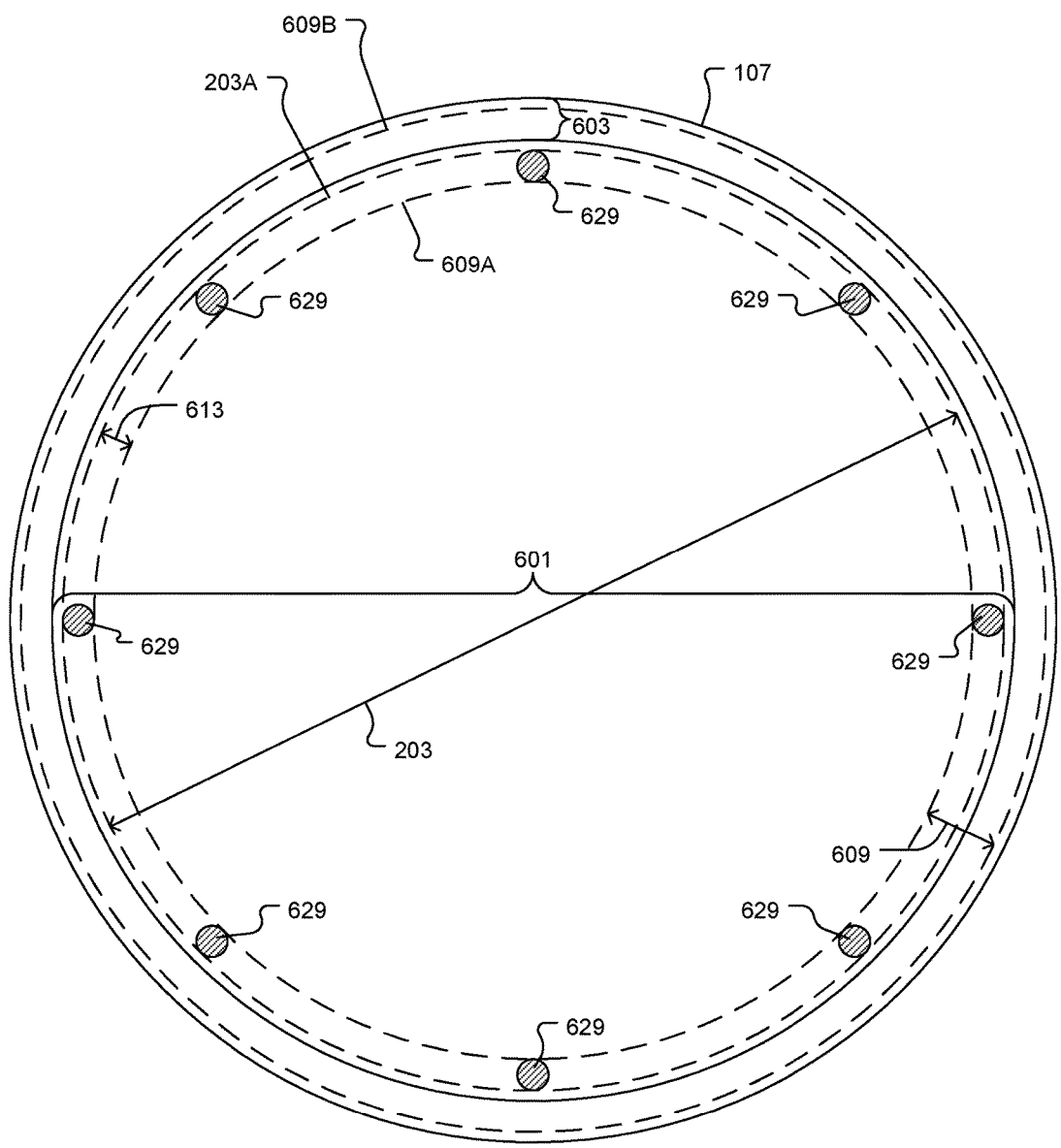
FIG. 6B shows a top view of the electrostatic chuck, in accordance with some embodiments of the present invention.

FIG. 6A shows an electrostatic chuck 107A formed of a ceramic material that has a stepped configuration, in accordance with some embodiments of the present invention. FIG. 6B shows a top view of the electrostatic chuck 107A, in accordance with some embodiments of the present invention. The electrostatic chuck 107A includes a central region 601 and a peripheral region 603. The central region 601 includes the area configured to support the substrate 105. The peripheral region 603 is configured to circumscribe the central region 601. The electrostatic chuck 107A has a bottom surface that extends in a substantially uniform planar manner across both the central region 601 and the peripheral region 603. The central region 601 has a first overall thickness 605 as measured perpendicular to the bottom surface of the electrostatic chuck 107A. The peripheral region 603 has a second overall thickness 607 as measured perpendicular to the bottom surface of the electrostatic chuck 107A. The second overall thickness 607 is less than the first overall thickness 605, thereby giving the electrostatic chuck 107A the stepped configuration at its outer radial periphery. Also, an entirety of the primary RF power delivery electrode 203 is positioned within the central region 601 of the electrostatic chuck 107A at a location just below the clamp electrode(s) 201. And, the peripheral region 603 of the electrostatic chuck 107A includes a portion of a perimeter RF power delivery electrode 609. The perimeter RF power delivery electrode 609 also extends into the central region 601 of the electrostatic chuck 107A underneath an outer portion of the primary RF power delivery electrode 203.

The perimeter RF power delivery electrode 609 is formed at a vertical location within the electrostatic chuck 107A below the primary RF power delivery electrode 203. The perimeter RF power delivery electrode 609 has an annular shape defined by a top surface, a bottom surface, an inner edge 609A, and an outer edge 609B. In some embodiments, the top and bottom surfaces of the perimeter RF power delivery electrode 609 are oriented substantially parallel to the primary RF power delivery electrode 203. The inner edge 609A of the perimeter RF power delivery electrode 609 is positioned radially closer to the centerline 202 of the electrostatic chuck 107A than an outer edge 203A of the primary RF power delivery electrode 203, such that an overlap 613 exists between the primary RF power delivery electrode 203 and the perimeter RF power delivery electrode 609. Again, the centerline 202 of the electrostatic chuck 107A is considered to extend perpendicular to the top surface of the electrostatic chuck 107A at a centerpoint of the top surface of the electrostatic chuck 107A. The outer edge 609B of the perimeter RF power delivery electrode 609 is positioned farther from the centerline 202 of the electrostatic chuck 107A than the outer edge 203A of the primary RF power delivery electrode 601. The extension of the perimeter RF power delivery electrode 609 radially outward beyond the primary RF power delivery electrode 601 allows for transmission of RF signals at locations around the radial perimeter of the substrate 105, which can be used to improve processing performance at the radial edge of the substrate 105 in some processing applications. The perimeter RF power delivery electrode 609 provides an extension of the RF coupling to the plasma beyond the outer radial perimeter of the substrate 105 so as to improve process performance at the outermost regions and edge of the substrate 105.

To provide for electrical connection of the perimeter RF power delivery electrode 609 and the primary RF power delivery electrode 203 to the lower support structure 109, a plurality of RF power delivery connection modules 629 is distributed in a substantially uniform manner about a perimeter of the electrostatic chuck 107A, with each of the plurality of RF power delivery connection modules 629 providing a low impedance transmission path for RF signals between the lower support structure 109 and the perimeter RF power delivery electrode 609 and the primary RF power delivery electrode 203. The plurality of RF power delivery connection modules 629 can be distributed around the periphery of the electrostatic chuck 107A in the same manner as discussed herein with regard to distribution of the plurality of RF power delivery connection modules 209 about the periphery of the electrostatic chuck 107.

Figure 6C:
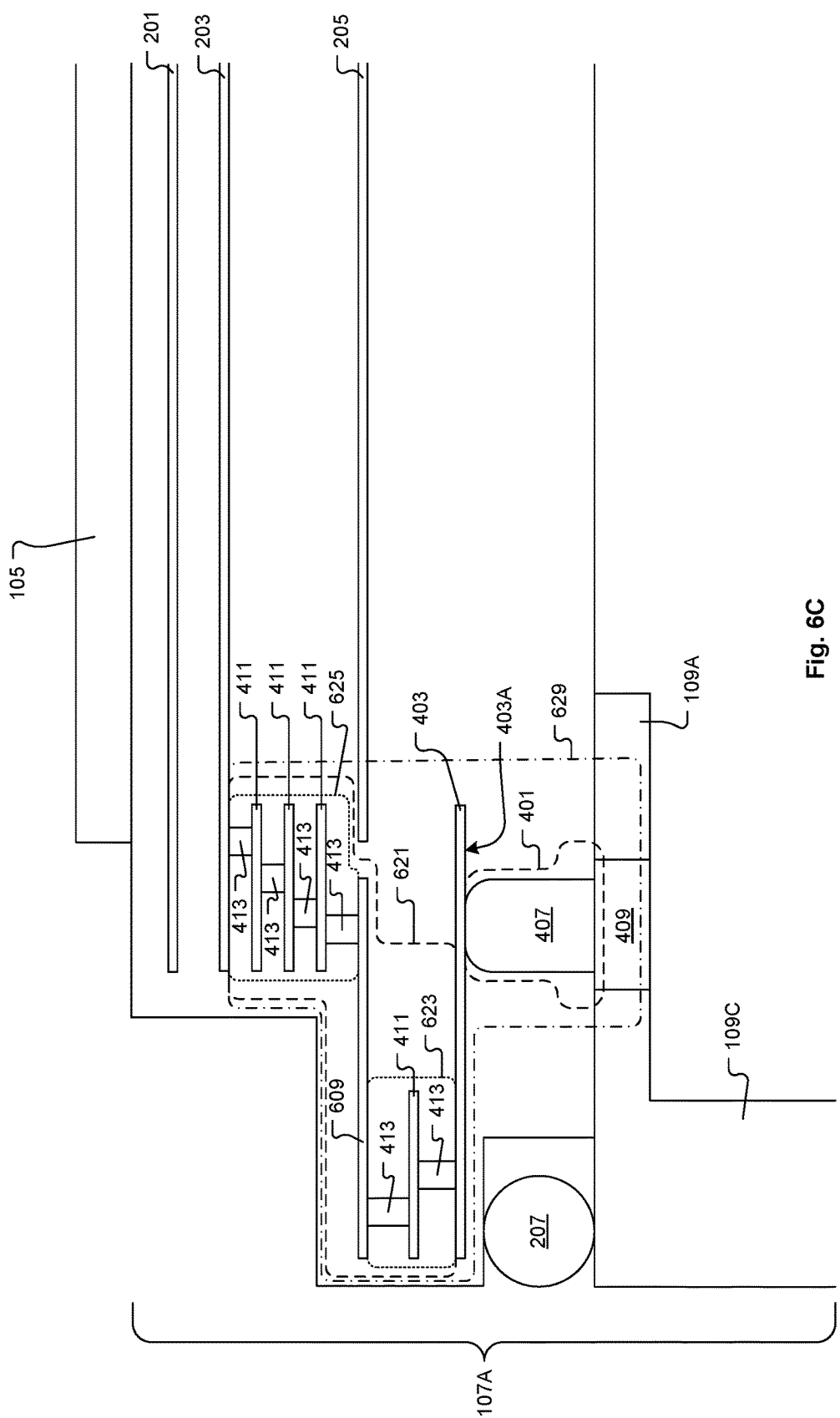
FIG. 6C shows a vertical cross-section view through one of the plurality of RF power delivery connection modules, in accordance with some embodiments of the present invention.

FIG. 6C shows a vertical cross-section view through one of the plurality of RF power delivery connection modules 629, in accordance with some embodiments of the present invention. In some embodiments, each of the RF power delivery connection modules 629 includes the first electrical connection 401 extending between the lower support structure 109 and the exposed embedded conductive segment 403 within the electrostatic chuck 107A, with the portion 403A of the exposed embedded conductive segment 403 being exposed at a bottom of the electrostatic chuck 107A. As previously discussed with regard to FIG. 4, the first electrical connection 401 can be formed by the electrically conductive pin 407 in some embodiments. Alternatively, in other embodiments, the first electrical connection 401 can be formed by a brazed or soldered connection extending between the lower support structure 109 and the exposed embedded conductive segment 403.

Each of the RF power delivery connection modules 629 includes a second electrical connection 621 extending between the exposed embedded conductive segment 403 through the electrostatic chuck 107A to the primary RF power delivery electrode 203. The second electrical connection 621 includes a lower electrical connection 623 extending through the electrostatic chuck 107A from the exposed embedded conductive segment 403 to the perimeter RF power delivery electrode 609. The second electrical connection 621 also includes and an upper electrical connection 625 extending through the electrostatic chuck 107A from the perimeter RF power delivery electrode 609 to the primary RF power delivery electrode 203. The lower electrical connection 623 can be formed using a number of interior embedded conductive segments 411 and vertical conductive structures 413, in a manner similar to that discussed with regard to the second electrical connection 405 of FIG. 4. In the example of FIG. 6C, one of the interior embedded conductive segments 411 and two vertical conductive structures 413 are used to form the lower electrical connection 623 extending from the exposed embedded conductive segment 403 to the perimeter RF power delivery electrode 609. Similarly, the upper electrical connection 625 can be formed using a number of interior embedded conductive segments 411 and vertical conductive structures 413, in a manner similar to that discussed with regard to the second electrical connection 405 of FIG. 4. In the example of FIG. 6C, three interior embedded conductive segments 411 and four vertical conductive structures 413 are used to form the upper electrical connection 625 extending from the perimeter RF power delivery electrode 609 to the primary RF power delivery electrode 203.

In some embodiments, such as that shown in FIG. 6C, the RF signals are transmitted through the perimeter RF power delivery electrode 609 to the primary RF power delivery electrode 203. However, in other embodiments, the RF signals can be first transmitted to the primary RF power delivery electrode 203 and then through the primary RF power delivery electrode 203 to the perimeter RF power delivery electrode 609. Also, in some embodiments, the RF signals can be transmitted from the lower support structure 109 to the perimeter RF power delivery electrode 609 without first traversing through the primary RF power delivery electrode 203, and the RF signals can be transmitted from the lower support structure 109 to the primary RF power delivery electrode 203 without first traversing through the perimeter RF power delivery electrode 609.

Also, in some embodiments, the perimeter RF power delivery electrode 609 can be electrically isolated from the primary RF power delivery electrode 203, with a portion of the ceramic of the electrostatic chuck 107A acting as an insulator therebetween. In these embodiments, each of the perimeter RF power delivery electrode 609 and the primary RF power delivery electrode 203 can be independently connected to receive RF signals directly from the lower support structure 109. Also, in this configuration, in some embodiments, the RF signal transmission pathways to each of the perimeter RF power delivery electrode 609 and the primary RF power delivery electrode 203 can be independently controlled, so as to provide for independent control of RF current delivered to the periphery of the electrostatic chuck 107A versus RF current delivered to the substrate 105 supporting central region 601 of the electrostatic chuck 107A. Therefore, in various embodiments, having both the perimeter RF power delivery electrode 609 and the primary RF power delivery electrode 203 will provide for application of additional RF signal frequencies at the perimeter RF power delivery electrode 609, but not at the primary RF power delivery electrode 203, vice-versa, thereby providing increased operational flexibility for substrate 105 edge processing.

Figure 6D:
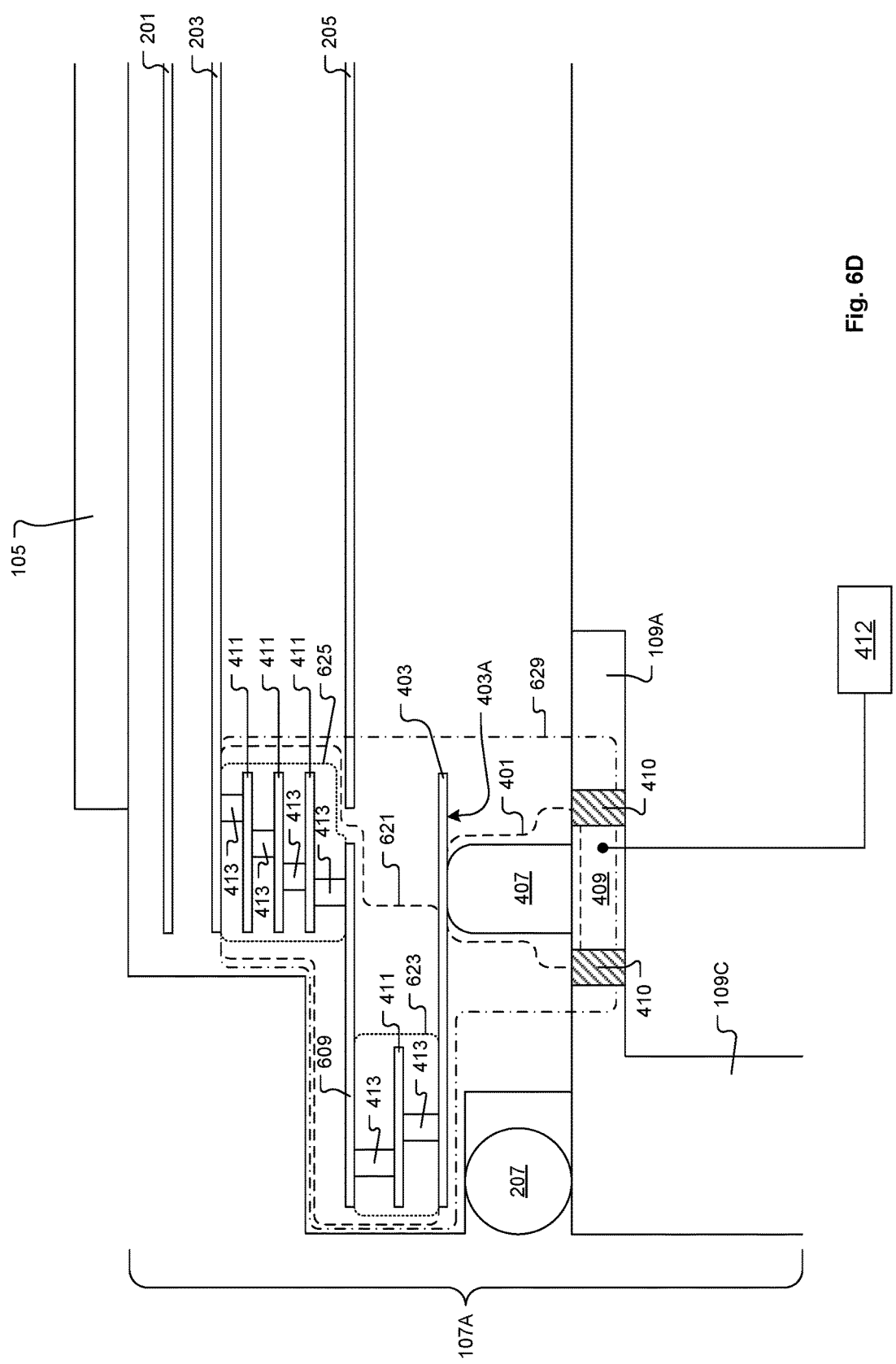
FIG. 6D shows a vertical cross-section view through one of the plurality of RF power delivery connection modules in which the first electrical connection is electrically isolated from the lower support structure, such that independently controlled RF signals can be transmitted to the plurality of RF power delivery connection modules and the lower support structure, respectively, in accordance with some embodiments of the present invention.

FIG. 6D shows a vertical cross-section view through one of the plurality of RF power delivery connection modules 629 in which the first electrical connection 401 is electrically isolated from the lower support structure 109, such that independently controlled RF signals can be transmitted to the plurality of RF power delivery connection modules 629 and the lower support structure 109, respectively, in accordance with some embodiments of the present invention. In the example of FIG. 6D, the base structure 409 of the electrically conductive pin 407 is disposed within an electrically insulating member 410, such as a dielectric sleeve, so that the base structure 409 is electrically isolated from the lower support structure 109. The base structure 409 of the electrically conductive pin 407 is connected to an RF power source 412, by way of appropriate RF impedance matching circuitry. In this configuration, RF signals generated by the RF power source 412 are conducted to the base structure 409, and from the base structure 409 to the electrically conductive pin 407, and from the electrically conductive pin 407 to the exposed embedded conductive segment 403, without being conducted through the lower support structure 109. In some embodiments, the RF power source 412 is connected to the RF control module 165, such that RF signals transmitted from the RF power source 412 to the base structure 409 of the electrically conductive pin 407 are controlled by the RF control module 165.

With reference back to FIG. 1, the system can also include a first voltage sensor 161 connected to measure electrical voltage (V1) on the primary RF power delivery electrode 203, and a second voltage sensor 163 connected to measure electrical voltage (V2) on the clamp electrode(s) 201. The first voltage sensor 161 and the second voltage sensor 163 are defined and disposed separate from the connections used to deliver RF signals from the lower support structure 109 to the primary RF power delivery electrode 203. Each of the first voltage sensor 161 and the second voltage sensor 163 is connected to transmit signals indicating their respective measured voltages V1 and V2 to an RF control module 165. The RF control module 165 is configured to determine an amount of RF current transmission from the primary RF power delivery electrode 203 through the top surface of the electrostatic chuck 107, using the measured electrical voltage V1 on the primary RF power delivery electrode 203 and the measured electrical voltage V2 on the clamp electrode(s) 201 and the electrical capacitance C between the primary RF power delivery electrode 203 and the clamp electrode(s) 201. Also, in some embodiments, the RF control module 165 is further configured to transmit control signals through a connection 166 to the RF power source 129 in order to control the RF power source 129 in a closed-loop feedback manner based on the determined amount of RF current transmission from the primary RF power delivery electrode 203 through the top surface of the electrostatic chuck 107, so as to deliver a prescribed amount of RF current through the top surface of the electrostatic chuck 107. Also, in some embodiments, the RF control module 165 is further configured to transmit control signals through the connection 166 to the RF power source 129 in order to control the RF power source 129 in a closed-loop feedback manner to control a voltage present on the substrate 105. Also, in some embodiments, the RF control module 165 is further configured to transmit control signals through the connection 166 to the RF power source 129 in order to control the RF power source 129 in a closed-loop feedback manner to control an amount of RF power, with consideration of phase, transmitted through the top surface of the electrostatic chuck 107.

The capacitance (C) between the primary RF power delivery electrode 203 and the clamp electrode(s) 201 can be measured or calculated based on the dielectric constant of the ceramic material of the electrostatic chuck 107 and the geometry of the primary RF power delivery electrode 203 and the clamp electrode(s) 201. Then, with the capacitance (C) between the primary RF power delivery electrode 203 and the clamp electrode(s) 201 determined, the reactance (Xc) of the ceramic material of the electrostatic chuck 107 between the primary RF power delivery electrode 203 and the clamp electrode(s) 201 can be determined as the inverse of the quantity $(2*\pi*f*C)$, where the frequency f is in Hz and the capacitance C is in farads, i.e., $Xc=1/(2\pi fC)$. Then, the real-time RF current (I) being transmitted from the primary RF power delivery electrode 203 to the clamp electrode(s) 201 can be determined by dividing the measured voltage differential between the primary RF power delivery electrode 203 and the clamp electrode(s) 201 (|V1−V2|) by the determined reactance (Xc) of the ceramic material of the electrostatic chuck 107, i.e., $I=(|V1-V2|)/Xc$. The real-time RF current (I) represents the RF current flowing out into the plasma processing region 119 through the substrate 105. Also, it should be appreciated that because the real-time RF current (I) is based on the measured voltages on the primary RF power delivery electrode 203 and the clamp electrode(s) 201, the real-time RF current (I) is not skewed by parasitic RF currents flowing along peripheral structures within the plasma processing chamber 101 relative to the electrostatic chuck 107. Additionally, any small residual parasitic current loss can be accounted for by calibration and compensation.

In contrast, RF current measured downstream near the reference ground potential 125 will include RF current flowing through the plasma processing region 119 and parasitic RF currents flowing along the peripheral structures within the chamber 101. And, for low density plasma 133, the parasitic RF currents will dominate the RF current measured downstream near the reference ground potential 125. Therefore, measuring RF current downstream near the reference ground potential 125 may not provide a reliable measurement of just the RF current flowing through the plasma processing region 119, particularly in the case of low density plasma 133 operation. However, the method discussed above for using the measured electrical voltage V1 on the primary RF power delivery electrode 203 and the measured electrical voltage V2 on the clamp electrode(s) 201 and the electrical capacitance C between the primary RF power delivery electrode 203 and the clamp electrode(s) 201 to determine the amount of RF current transmission from the primary RF power delivery electrode 203 through the top surface of the electrostatic chuck 107 into the plasma processing region 119 can be used in lieu of measuring RF current downstream near the reference ground potential 125.

Figure 7:
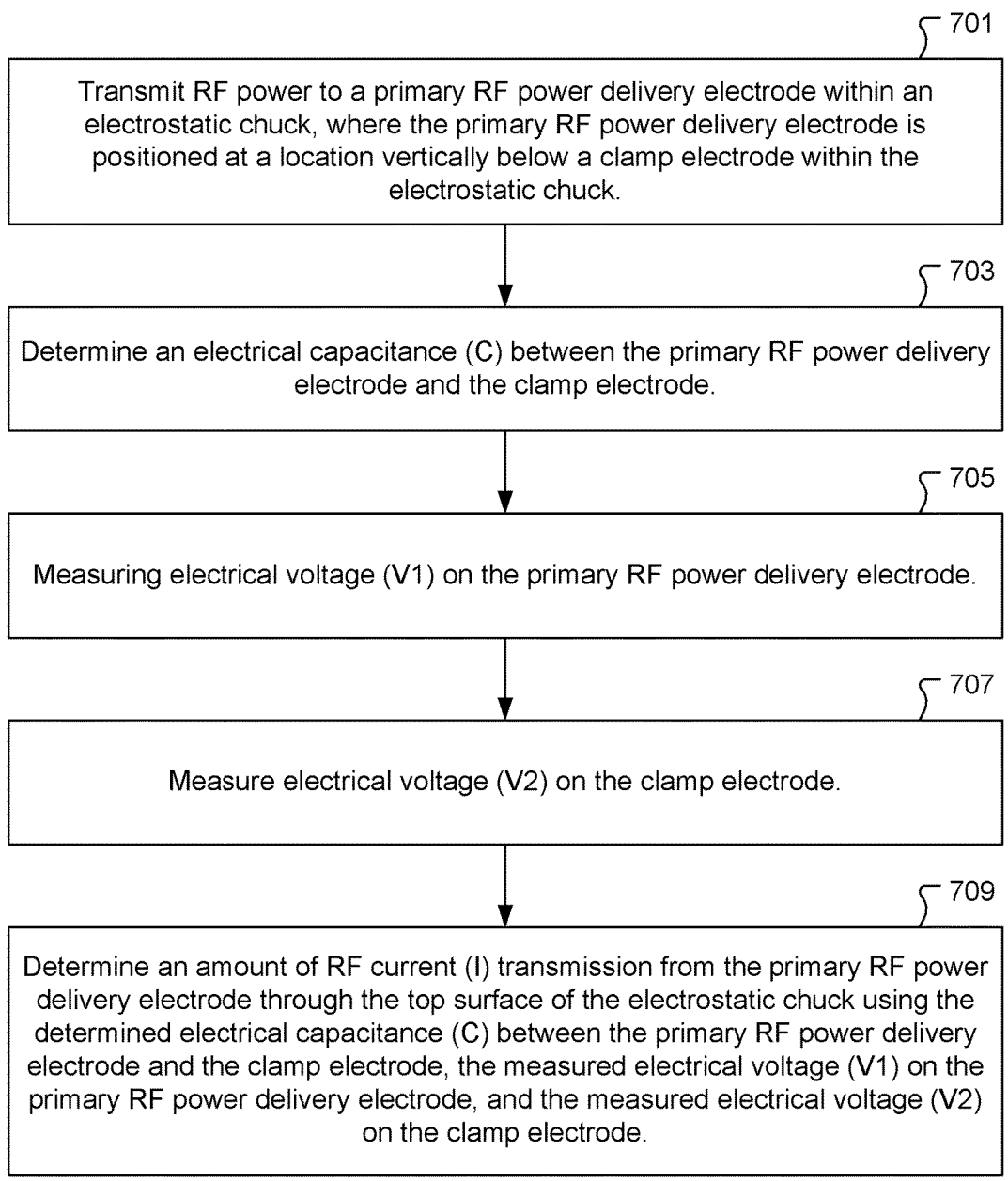
FIG. 7 shows a flowchart of a method for determining RF current transmission in a plasma processing operation, in accordance with some embodiments of the present invention.

FIG. 7 shows a flowchart of a method for determining RF current transmission in a plasma processing operation, in accordance with some embodiments of the present invention. The method includes an operation 701 for transmitting RF power to a primary RF power delivery electrode (203) within an electrostatic chuck (107/107A). The primary RF power delivery electrode (203) is positioned within the ceramic of the electrostatic chuck (107/107A) in an orientation substantially parallel to a top surface of the electrostatic chuck (107/107A). The top surface of the electrostatic chuck (107/107A) includes an area configured to support a substrate (105). The primary RF power delivery electrode (203) is positioned at a location vertically below a clamp electrode(s) (201) within the electrostatic chuck (107/107A) such that a region of the electrostatic chuck (107/107A) between the primary RF power delivery electrode (203) and the clamp electrode(s) (201) is substantially free of other electrically conductive material. Each of the primary RF power delivery electrode (203) and the clamp electrode(s) (201) is configured to extend horizontally through the electrostatic chuck (107/107A) to at least span an area underlying the area of the top surface of the electrostatic chuck (107/107A) that is configured to support the substrate (105). The operation 701 for transmitting RF power to the primary RF power delivery electrode (203) within the electrostatic chuck (107/107A) can include transmitting RF signals to a lower support structure (109) of the electrostatic chuck (107/107A) so that the RF signals travel from the lower support structure (109) to a plurality of RF power delivery connection modules (209/629) distributed in a substantially uniform manner about a perimeter of the electrostatic chuck (107/107A), and so that the RF signals travel through each of the plurality the RF power delivery connection modules (209/629) to the primary RF power delivery electrode (203) at respective locations of the plurality of RF power delivery connection modules (209/629).

The method also includes an operation 703 for determining an electrical capacitance (C) between the primary RF power delivery electrode (203) and the clamp electrode(s) (201). The method also includes an operation 705 for measuring electrical voltage (V1) on the primary RF power delivery electrode (203). The method also includes an operation 707 for measuring electrical voltage (V2) on the clamp electrode(s) (201). The method also includes an operation 709 for determining an amount of RF current (I) transmission from the primary RF power delivery electrode (203) through the top surface of the electrostatic chuck (107/107A) using the determined electrical capacitance (C) between the primary RF power delivery electrode (203) and the clamp electrode(s) (201), the measured electrical voltage (V1) on the primary RF power delivery electrode (203), and the measured electrical voltage (V2) on the clamp electrode(s) (201). The operation 709 for determining the amount of RF current (I) transmission from the primary RF power delivery electrode (203) through the top surface of the electrostatic chuck (107/107A) includes multiplying a difference between the measured electrical voltage (V1) on the primary RF power delivery electrode (203) and the measured electrical voltage (V2) on the clamp electrode(s) (201) by the determined electrical capacitance (C) between the primary RF power delivery electrode (203) and the clamp electrode(s) (201).

By incorporating voltage monitoring circuitry within the electrostatic chuck 107/107A close to the substrate 105, such as that associated with the first voltage sensor 161 connected to measure electrical voltage (V1) on the primary RF power delivery electrode 203 and the second voltage sensor 163 connected to measure electrical voltage (V2) on the clamp electrode(s) 201, or at least pick up electrodes and connections for that purpose internal to the electrostatic chuck 107/107A structure, it is possible to obtain a more accurate point-of-use broadband measurement of the RF current transmitted from the electrostatic chuck 107/107A to the plasma processing region 119. The point-of-use broadband measurement of the RF current flowing into the plasma processing region 119 can be used for diagnostics, monitoring, and/or control purposes. For example, the point-of-use broadband measurement of the RF current flowing into the plasma processing region 119 can be processed through external circuitry, such as within the RF control module 165, to implement control strategies such as real-time closed-loop feedback control of the RF current transmitted into the plasma processing region 119. Also, with sufficiently accurate resolution of the phases of the RF voltage and RF current at the point-of-use, i.e., near the substrate 105 support area, the delivered broadband RF power at the point-of-use can be determined and optionally used for control purposes.

By measuring the voltage differential between at least two positions within the electrostatic chuck 107/107A (such as on the primary RF power delivery electrode 203 and on the clamp electrode(s) 201, near the substrate 105 support location) and by knowing the impedance (reactance) between the at least two positions, it is possible to determine the RF current flowing between the at least two positions without implementation of specialized current measurement hardware. And, because the voltage measurements are made at locations high in the electrostatic chuck 107/107A near the substrate 105 support location, the voltage measurements are relative immune from parasitic RF currents flowing into parallel stray capacitances presented by surrounding support structures, such as those presented by a surrounding ceramic isolation ring, among other structures. The relative immunity of the voltage measurements from these parasitic RF currents provides a significant advantage in that the point-of-use broadband measurement of the RF current transmitted from the electrostatic chuck 107/107A to the plasma processing region 119 represents essentially only the RF current flowing to and through the substrate 105. Then, by knowing the RF current flowing from the electrostatic chuck 107/107A through the substrate 105 to the plasma processing region 119, and by knowing the capacitance of the substrate 105, it is possible to determine the voltage on the substrate 105. And, as previously mentioned, the RF control module 165 can be operated to transmit control signals through the connection 166 to the RF power source 129 in order to control the RF power source 129 in a closed-loop feedback manner to control one or more of the voltage on the substrate 105, the RF current transmitted through the substrate 105, and the RF power transmitted through the substrate 105.

FIG. 8 shows a flowchart of a method for manufacturing an electrostatic chuck (107/107A), in accordance with some embodiments of the present invention. The method includes an operation 801 for forming a ceramic assembly of the electrostatic chuck (107/107A) having a top surface including an area configured to support a substrate (105). The operation 801 includes positioning one or more clamp electrode(s) (201) within the ceramic assembly in an orientation substantially parallel to the top surface of the ceramic assembly and at an upper location within the ceramic assembly such that a region of the ceramic assembly between the clamp electrode(s) (201) and the top surface of the ceramic assembly is substantially free of other electrically conductive material. The operation 801 includes positioning a primary RF power delivery electrode (203) within the ceramic assembly in an orientation substantially parallel to the top surface of the ceramic assembly and at a location vertically below the clamp electrode(s) (201) such that a region of the ceramic assembly between the primary RF power delivery electrode (203) and the clamp electrode(s) (201) is substantially free of other electrically conductive material. The primary RF power delivery electrode (203) is configured to extend horizontally through the ceramic assembly to at least span an area underlying the area of the top surface of the ceramic assembly that is configured to support the substrate (105). The operation 801 includes positioning a plurality of RF power delivery connection modules (209/629) in a substantially uniformly distributed manner about a perimeter of the ceramic assembly. Each of the plurality of RF power delivery connection modules (209/629) is configured to form an electrical connection from a lower support structure (109) to the primary RF power delivery electrode (203) at its respective location so as to form an RF power transmission path from the lower support structure (109) to the primary RF power delivery electrode (203) at its respective location.

The method also includes an operation 803 for attaching the ceramic assembly to the lower support structure (109). The lower support structure (109) is formed of an electrically conductive material. The lower support structure (109) as has a bowl shape formed by a bottom plate member (109B) and an annular-shaped wall member (109C) extending upward from the bottom plate member (109B). The ceramic assembly is attached to the lower support structure (109) such that an outer peripheral region of a bottom surface of the ceramic assembly is supported by a top surface of the annular-shaped wall member (109C) of the lower support structure (109) with an interior region of the lower support structure (109) exposed to a portion the bottom surface of the ceramic assembly.

As discussed herein, the lower support structure 109, the plurality of RF power delivery connection modules 209/629, and the primary RF power delivery electrode 203 together form a Faraday cage to direct RF power transmission around an interior region of the electrostatic chuck 107/107A present between a bottom surface of the electrostatic chuck 107/107A and the primary RF power delivery electrode 203 and within a circumference about the electrostatic chuck 107/107A along which the plurality of RF power delivery connection modules 209/629 is located. With this Faraday cage serving to conduct RF currents around the interior region of the electrostatic chuck 107/107A, internal components and circuitry within the interior region of the electrostatic chuck 107/107A are protected from RF induced damage. Also, the Faraday cage configuration serves to deliver the RF signals to the upper region of the electrostatic chuck 107/107A in a uniform manner, which translates into a more uniform plasma density across the substrate 105. Additionally, because the primary RF power delivery electrode 203 is located near the top surface of the electrostatic chuck 107/107A in the Faraday cage configuration, it is possible to reliably deliver lower frequency RF signals, e.g., 2 MHz down to 400 kHz or less, to the plasma processing region 119. And, because the lower frequency RF signals are transmitted around the interior region of the electrostatic chuck 107/107A, there is a significantly reduced likelihood of parasitic discharge within the interior region of the electrostatic chuck 107/107A.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A substrate support system, comprising:
    a ceramic assembly having a top surface and a bottom surface, the top surface including an area configured to support a substrate;
    at least one clamp electrode positioned within the ceramic assembly;
    a primary radiofrequency (RF) power delivery electrode positioned within the ceramic assembly at a location vertically below the at least one clamp electrode;
    a lower support structure formed of an electrically conductive material, the ceramic assembly secured to the lower support structure such that an outer peripheral region of the bottom surface of the ceramic assembly is supported by the lower support structure, the lower support structure including a hollow interior region exposed to a portion the bottom surface of the ceramic assembly; and
    a plurality of electrical connections established between the lower support structure and the primary RF power delivery electrode, each of the plurality of electrical connections extending through a respective portion of the ceramic assembly.

2. The substrate support system as recited in claim 1, wherein the plurality of electrical connections are distributed within a peripheral region of the ceramic assembly.

3. The substrate support system as recited in claim 1, wherein the plurality of electrical connections are positioned in a substantially equally spaced apart manner as measured azimuthally about a centerline of the ceramic assembly extending perpendicular to the top surface of the ceramic assembly.

4. The substrate support system as recited in claim 1, wherein each of the plurality of electrical connections includes a corresponding exposed embedded conductive structure that is accessible from the bottom surface of the ceramic assembly.

5. The substrate support system as recited in claim 4, wherein each of the plurality of electrical connections includes a corresponding electrically conductive pin in physical contact with the corresponding exposed embedded conductive structure and in electrical connection with the lower support structure.

6. The substrate support system as recited in claim 5, wherein the corresponding electrically conductive pin includes a spring configured to press the corresponding electrically conductive pin against the corresponding exposed embedded conductive structure.

7. The substrate support system as recited in claim 4, wherein each of the plurality of electrical connections includes a brazed connection or a soldered connection between the corresponding exposed embedded conductive structure and the lower support structure.

8. The substrate support system as recited in claim 4, wherein each of the plurality of electrical connections includes a corresponding interior embedded conductive segment and a corresponding first interior electrical connection and a corresponding second interior electrical connection, the corresponding interior embedded conductive segment positioned at a vertical location within the ceramic assembly between the corresponding exposed embedded conductive structure and the primary RF power delivery electrode, the corresponding first interior electrical connection electrically connecting the corresponding exposed embedded conductive structure to the corresponding interior embedded conductive segment, the corresponding second interior electrical connection electrically connecting the corresponding interior embedded conductive segment to the primary RF power delivery electrode.

9. The substrate support system as recited in claim 8, wherein the first interior electrical connection includes one or more vertical conductive structures, and the second interior electrical connection includes one or more vertical conductive structures.

10. The substrate support system as recited in claim 9, further comprising:
    one or more resistance heaters positioned within the ceramic assembly at a vertical position below the primary RF power delivery electrode, the corresponding interior embedded conductive segment positioned at a same vertical position as the one or more resistance heaters.

11. The substrate support system as recited in claim 10, wherein the plurality of electrical connections extend through the ceramic assembly at respective locations radially outside of the one or more resistance heaters relative to a centerline of the ceramic assembly extending perpendicular to the top surface of the ceramic assembly.

12. A ceramic assembly of an electrostatic chuck, comprising:
    a ceramic member having a top surface and a bottom surface, the top surface including an area configured to support a substrate;
    at least one clamp electrode positioned within the ceramic member;
    a primary radiofrequency (RF) power delivery electrode positioned within the ceramic member at a location vertically below the at least one clamp electrode;
    a plurality of exposed embedded conductive segments positioned in a distributed manner within a peripheral region of the ceramic member, wherein a portion of each exposed embedded conductive segment is accessible from the bottom surface of the ceramic member; and
    a plurality of electrical connections respectively extending between the plurality of exposed embedded conductive segments and the primary RF power delivery electrode, each of the plurality of electrical connections extending through a respective portion of the ceramic member.

13. The ceramic assembly of the electrostatic chuck as recited in claim 12, wherein the plurality of electrical connections are positioned in a substantially equally spaced apart manner as measured azimuthally about a centerline of the ceramic member extending perpendicular to the top surface of the ceramic member.

14. The ceramic assembly of the electrostatic chuck as recited in claim 12, wherein each of the plurality of electrical connections includes a corresponding interior embedded conductive segment and a corresponding first interior electrical connection and a corresponding second interior electrical connection, the corresponding interior embedded conductive segment positioned at a vertical location within the ceramic member between the exposed embedded conductive structure of the electrical connection and the primary RF power delivery electrode, the corresponding first interior electrical connection electrically connecting the corresponding exposed embedded conductive structure of the electrical connection to the corresponding interior embedded conductive segment, the corresponding second interior electrical connection electrically connecting the corresponding interior embedded conductive segment to the primary RF power delivery electrode.

15. The ceramic assembly of the electrostatic chuck as recited in claim 14, wherein the first interior electrical connection includes one or more vertical conductive structures, and the second interior electrical connection includes one or more vertical conductive structures.

16. The ceramic assembly of the electrostatic chuck as recited in claim 12, wherein a given one of the plurality of electrical connections includes one or more interior embedded conductive segments within the ceramic member, and wherein the given one of the plurality of electrical connections includes vertical conductive structures positioned to electrically connect the one or more interior embedded conductive segments to each other and to the exposed embedded conductive segment of the given one of the plurality of electrical connections and to the primary RF power delivery electrode.

17. The ceramic assembly of the electrostatic chuck as recited in claim 16, wherein each of the one or more interior embedded conductive segments is oriented substantially parallel to the primary RF power delivery electrode.

18. The ceramic assembly of the electrostatic chuck as recited in claim 16, wherein at least one of the vertical conductive structures extends through the ceramic member between the exposed embedded conductive segment of the given one of the plurality of electrical connections and a lowest one of the interior embedded conductive segments of the given one of the plurality of electrical connections, and wherein at least one of the vertical conductive structures extends through the ceramic member between a highest one of the interior embedded conductive segments of the given one of the plurality of electrical connections and the primary RF power delivery electrode, and wherein at least one of the vertical conductive structures extends through the ceramic member between each vertically neighboring set of two of the interior embedded conductive segments of the given one of the plurality of electrical connections when present.

19. The ceramic assembly of the electrostatic chuck as recited in claim 12, further comprising:
   one or more resistance heaters positioned within the ceramic member at a vertical position below the primary RF power delivery electrode, wherein the plurality of electrical connections extend through the ceramic member at respective locations radially outside of the one or more resistance heaters relative to a centerline of the ceramic member extending perpendicular to the top surface of the ceramic member.

20. The ceramic assembly of the electrostatic chuck as recited in claim 12, wherein the primary RF power delivery electrode is sectioned in a radially symmetric manner about a centerline of the ceramic member extending perpendicular to the top surface of the ceramic member, with each section of the primary RF power delivery electrode separated from adjacent sections of the primary RF power delivery electrode, and with each section of the primary RF power delivery electrode electrically connected to a separate one of the plurality of electrical connections.

* * * * *